US011287486B2

(12) United States Patent
Boysel

(10) Patent No.: US 11,287,486 B2
(45) Date of Patent: Mar. 29, 2022

(54) 3D MEMS MAGNETOMETER AND ASSOCIATED METHODS

(71) Applicant: MOTION ENGINE INC., Montréal (CA)

(72) Inventor: Robert Mark Boysel, Montréal (CA)

(73) Assignee: Motion Engine, Inc., Montreal (CA)

( * ) Notice: Subject to any disclaimer, the term of this patent is extended or adjusted under 35 U.S.C. 154(b) by 92 days.

(21) Appl. No.: 15/534,702

(22) PCT Filed: Dec. 2, 2015

(86) PCT No.: PCT/CA2015/051259
§ 371 (c)(1),
(2) Date: Jun. 9, 2017

(87) PCT Pub. No.: WO2016/090467
PCT Pub. Date: Jun. 16, 2016

(65) Prior Publication Data
US 2017/0363694 A1 Dec. 21, 2017

Related U.S. Application Data

(60) Provisional application No. 62/089,502, filed on Dec. 9, 2014.

(51) Int. Cl.
*G01R 33/26* (2006.01)
*G01R 33/028* (2006.01)
*G01R 33/02* (2006.01)

(52) U.S. Cl.
CPC ..... *G01R 33/0286* (2013.01); *G01R 33/0206* (2013.01); *B81B 2201/02* (2013.01)

(58) Field of Classification Search
CPC ............ G01R 33/0206; G01R 33/0286; B81B 2201/02; B81B 2201/0228; B81B 2201/0235; B81B 2201/025
See application file for complete search history.

(56) References Cited

U.S. PATENT DOCUMENTS 4,430,895 A 2/1984 Colton
4,483,194 A 11/1984 Rudolf
(Continued)

FOREIGN PATENT DOCUMENTS

CN 103350983 A 10/2013
EP 1802952 A1 7/2007
(Continued)

OTHER PUBLICATIONS

Boysel, A Single-Proof-Mass MEMS Multi-Axis Motion Sensor. Semicon Japan. 6 pages. (2008).
(Continued)

*Primary Examiner* — Jermele M Hollington
*Assistant Examiner* — Taqi R Nasir
(74) *Attorney, Agent, or Firm* — McCarter & English, LLP

(57) ABSTRACT

A micro-electro-mechanical system (MEMS) magnetometer is provided for measuring magnetic field components along three orthogonal axes. The MEMS magnetometer includes a top cap wafer, a bottom cap wafer and a MEMS wafer having opposed top and bottom sides bonded respectively to the top and bottom cap wafers. The MEMS wafer includes a frame structure and current-carrying first, second and third magnetic field transducers. The top cap, bottom cap and MEMS wafer are electrically conductive and stacked along the third axis. The top cap wafer, bottom cap wafer and frame structure together form one or more cavities enclosing the magnetic field transducers. The MEMS magnetometer further includes first, second and third electrode assemblies, the first and second electrode assemblies being formed in the top and/or bottom cap wafers. Each electrode assembly is configured to sense an output of a respective magnetic field transducer induced by a respective magnetic field component.

38 Claims, 21 Drawing Sheets

(56) References Cited

U.S. PATENT DOCUMENTS

| | | |
|---|---|---|
| 4,553,436 A | 11/1985 | Hansson |
| 4,590,801 A | 5/1986 | Merhav |
| 4,592,233 A | 6/1986 | Peters |
| 4,805,456 A | 2/1989 | Howe et al. |
| 4,833,417 A | 5/1989 | Schroeder |
| 4,881,408 A | 11/1989 | Hulsing, II et al. |
| 4,882,933 A | 11/1989 | Petersen et al. |
| 4,905,523 A | 3/1990 | Okada |
| 4,967,605 A | 11/1990 | Okada |
| 5,177,661 A | 1/1993 | Zavracky et al. |
| 5,235,457 A | 8/1993 | Lichtman et al. |
| 5,239,984 A | 8/1993 | Cane et al. |
| 5,359,893 A | 11/1994 | Dunn |
| 5,557,046 A | 9/1996 | Hulsing, II |
| 5,596,144 A | 1/1997 | Swanson |
| 5,608,210 A | 3/1997 | Esparza et al. |
| 5,614,742 A | 3/1997 | Gessner et al. |
| 5,623,270 A | 4/1997 | Kempkes et al. |
| 5,635,639 A | 6/1997 | Greiff et al. |
| 5,646,346 A | 7/1997 | Okada |
| 5,662,111 A | 9/1997 | Cosman |
| 5,777,226 A | 7/1998 | Ip |
| 5,831,163 A | 11/1998 | Okada |
| 5,894,090 A | 4/1999 | Tang et al. |
| 5,895,850 A | 4/1999 | Buestgens |
| 5,898,223 A | 4/1999 | Frye et al. |
| 5,920,011 A | 7/1999 | Hulsing, II |
| 5,959,206 A | 9/1999 | Ryrko et al. |
| 5,962,784 A | 10/1999 | Hulsing, II |
| 5,977,640 A | 11/1999 | Bertin et al. |
| 5,987,985 A | 11/1999 | Okada |
| 5,992,233 A | 11/1999 | Clark |
| 6,003,371 A | 12/1999 | Okada |
| 6,028,773 A | 2/2000 | Hundt |
| 6,053,057 A | 4/2000 | Okada |
| 6,058,778 A | 5/2000 | Chan et al. |
| 6,079,272 A | 6/2000 | Stell et al. |
| 6,090,638 A | 7/2000 | Vigna et al. |
| 6,091,132 A | 7/2000 | Bryant |
| 6,119,517 A | 9/2000 | Breng et al. |
| 6,122,961 A | 9/2000 | Geen et al. |
| 6,159,773 A | 12/2000 | Lin |
| 6,184,052 B1 | 2/2001 | Vigna et al. |
| 6,225,699 B1 | 5/2001 | Ference et al. |
| 6,235,550 B1 | 5/2001 | Chan et al. |
| 6,257,057 B1 | 7/2001 | Hulsing, II |
| 6,282,956 B1 | 9/2001 | Okada |
| 6,295,870 B1 | 10/2001 | Hulsing, II |
| 6,391,673 B1 | 5/2002 | Ha et al. |
| 6,399,997 B1 | 6/2002 | Lin et al. |
| 6,469,330 B1 | 10/2002 | Vigna et al. |
| 6,487,000 B2 | 11/2002 | Mastromatteo et al. |
| 6,490,923 B1 | 12/2002 | Breng et al. |
| 6,508,124 B1 | 1/2003 | Zerbini et al. |
| 6,539,801 B1 | 4/2003 | Gutierrez et al. |
| 6,584,845 B1 | 7/2003 | Gutierrez et al. |
| 6,587,312 B2 | 7/2003 | Murari et al. |
| 6,621,137 B1 | 9/2003 | Ma et al. |
| 6,651,500 B2 | 11/2003 | Stewart et al. |
| 6,675,630 B2 | 1/2004 | Challoner et al. |
| 6,696,364 B2 | 2/2004 | Gelmi et al. |
| 6,701,786 B2 | 3/2004 | Hulsing, II |
| 6,705,167 B2 | 3/2004 | Kvisteroey et al. |
| 6,715,353 B2 | 4/2004 | Johnson |
| 6,718,823 B2 | 4/2004 | Platt |
| 6,766,689 B2 | 7/2004 | Spinola Durante et al. |
| 6,772,632 B2 | 8/2004 | Okada |
| 6,808,952 B1 | 10/2004 | Sniegowski et al. |
| 6,808,955 B2 | 10/2004 | Ma |
| 6,829,937 B2 | 12/2004 | Mahon |
| 6,841,861 B2 | 1/2005 | Brady |
| 6,856,144 B2 | 2/2005 | Lasalandra et al. |
| 6,863,832 B1 | 3/2005 | Wiemer et al. |
| 6,865,943 B2 | 3/2005 | Okada |
| 6,892,575 B2 | 5/2005 | Nasiri et al. |
| 6,925,875 B2 | 8/2005 | Silverbrook |
| 6,939,473 B2 | 9/2005 | Nasiri et al. |
| 6,942,750 B2 | 9/2005 | Chou et al. |
| 6,944,931 B2 | 9/2005 | Shcheglov et al. |
| 6,953,985 B2 | 10/2005 | Lin et al. |
| 6,978,673 B2 | 12/2005 | Johnson et al. |
| 6,990,863 B2 | 1/2006 | Challoner et al. |
| 6,991,957 B2 | 1/2006 | Eskridge |
| 6,993,617 B2 | 1/2006 | Butcher et al. |
| 7,017,410 B2 | 3/2006 | Challoner et al. |
| 7,040,163 B2 | 5/2006 | Shcheglov et al. |
| 7,043,985 B2 | 5/2006 | Ayazi et al. |
| 7,056,757 B2 | 6/2006 | Ayazi et al. |
| 7,093,486 B2 | 8/2006 | Challoner et al. |
| 7,100,448 B2 | 9/2006 | Ikegami |
| 7,104,129 B2 | 9/2006 | Nasiri et al. |
| 7,138,694 B2 | 11/2006 | Nunan et al. |
| 7,159,441 B2 | 1/2007 | Challoner et al. |
| 7,160,752 B2 | 1/2007 | Ouellet et al. |
| 7,168,317 B2 | 1/2007 | Chen et al. |
| 7,168,318 B2 | 1/2007 | Challoner et al. |
| 7,176,556 B2 | 2/2007 | Okamoto et al. |
| 7,180,019 B1 | 2/2007 | Chiou et al. |
| 7,210,351 B2 | 5/2007 | Lo et al. |
| 7,217,588 B2 | 5/2007 | Hartzell et al. |
| 7,238,999 B2 | 7/2007 | LaFond et al. |
| 7,247,246 B2 | 7/2007 | Nasiri et al. |
| 7,250,112 B2 | 7/2007 | Nasiri et al. |
| 7,250,353 B2 | 7/2007 | Nasiri et al. |
| 7,258,008 B2 | 8/2007 | Durante et al. |
| 7,258,011 B2 | 8/2007 | Nasiri et al. |
| 7,258,012 B2 | 8/2007 | Xie |
| 7,275,424 B2 | 10/2007 | Felton et al. |
| 7,291,561 B2 | 11/2007 | Ma et al. |
| 7,318,349 B2 | 1/2008 | Vaganov et al. |
| 7,322,236 B2 | 1/2008 | Combi et al. |
| 7,322,237 B2 | 1/2008 | Kutsuna |
| 7,337,671 B2 | 3/2008 | Ayazi et al. |
| 7,347,095 B2 | 3/2008 | Shcheglov et al. |
| 7,360,423 B2 | 4/2008 | Ayazi et al. |
| 7,402,905 B2 | 7/2008 | Eskridge et al. |
| 7,417,329 B2 | 8/2008 | Chuang et al. |
| 7,442,570 B2 | 10/2008 | Nasiri et al. |
| 7,458,263 B2 | 12/2008 | Nasiri et al. |
| 7,484,410 B2 | 2/2009 | Tsuji et al. |
| 7,491,567 B2 | 2/2009 | DCamp et al. |
| 7,518,493 B2 | 4/2009 | Bryzek et al. |
| 7,541,588 B2 | 6/2009 | Tabirian et al. |
| 7,543,496 B2 | 6/2009 | Ayazi et al. |
| 7,578,189 B1 | 8/2009 | Mehregany |
| 7,615,406 B2 | 11/2009 | Higashi et al. |
| 7,617,729 B2 | 11/2009 | Axelrod et al. |
| 7,621,183 B2 | 11/2009 | Seeger et al. |
| 7,624,494 B2 | 12/2009 | Challoner et al. |
| 7,642,115 B2 | 1/2010 | Eriksen et al. |
| 7,642,657 B2 | 1/2010 | Suilleabhain et al. |
| 7,677,099 B2 | 3/2010 | Nasiri et al. |
| 7,684,101 B2 | 3/2010 | Border et al. |
| 7,689,321 B2 | 3/2010 | Karlsson |
| 7,690,254 B2 | 4/2010 | Pilchowski et al. |
| 7,694,563 B2 | 4/2010 | Durante et al. |
| 7,748,272 B2 | 7/2010 | Kranz et al. |
| 7,755,367 B2 | 7/2010 | Schoen et al. |
| 7,767,483 B1 | 8/2010 | Waters |
| 7,784,344 B2 | 8/2010 | Pavelescu et al. |
| 7,786,572 B2 | 8/2010 | Chen |
| 7,790,608 B2 | 9/2010 | Lauxtermann et al. |
| 7,810,379 B2 | 10/2010 | DeNatale et al. |
| 7,851,898 B2 | 12/2010 | Nakamura et al. |
| 7,863,698 B2 | 1/2011 | Seeger et al. |
| 7,875,942 B2 | 1/2011 | Cortese et al. |
| 7,882,740 B2 | 2/2011 | Okada |
| 7,886,601 B2 | 2/2011 | Merassi et al. |
| 7,898,043 B2 | 3/2011 | Ziglioli et al. |
| 7,908,921 B2 | 3/2011 | Binda et al. |
| 7,928,632 B2 | 4/2011 | Yang et al. |
| 7,929,143 B2 | 4/2011 | Wilfinger et al. |
| 7,934,423 B2 | 5/2011 | Nasiri et al. |
| 7,964,428 B2 | 6/2011 | Breng et al. |

(56) References Cited

U.S. PATENT DOCUMENTS

| | | |
|---|---|---|
| 7,971,483 B2 | 7/2011 | Supino et al. |
| 7,982,291 B2 | 7/2011 | Kuisma |
| 7,982,558 B2 | 7/2011 | Sworowski et al. |
| 7,987,714 B2 | 8/2011 | DeNatale et al. |
| 8,042,394 B2 | 10/2011 | Coronato et al. |
| 8,047,075 B2 | 11/2011 | Nasiri et al. |
| 8,049,515 B2 | 11/2011 | Schoen et al. |
| 8,069,726 B2 | 12/2011 | Seeger et al. |
| 8,071,398 B1 | 12/2011 | Yang et al. |
| 8,077,372 B2 | 12/2011 | Border et al. |
| 8,080,869 B2 | 12/2011 | Okudo et al. |
| 8,084,332 B2 | 12/2011 | Nasiri et al. |
| 8,100,012 B2 | 1/2012 | Martin et al. |
| 8,124,895 B2 | 2/2012 | Merassi et al. |
| 8,134,214 B2 | 3/2012 | Baldo et al. |
| 8,151,640 B1 | 4/2012 | Kubena |
| 8,166,816 B2 | 5/2012 | Ayazi et al. |
| 8,176,782 B2 | 5/2012 | Furukubo et al. |
| 8,220,328 B2 | 7/2012 | Rudolf et al. |
| 8,227,285 B1 | 7/2012 | Yang et al. |
| 8,227,911 B1 | 7/2012 | Yang et al. |
| 8,230,740 B2 | 7/2012 | Katsuki et al. |
| 8,236,577 B1 | 8/2012 | Hsu et al. |
| 8,258,590 B2 | 9/2012 | Geiger et al. |
| 8,272,266 B2 | 9/2012 | Zhang et al. |
| 8,283,737 B2 | 10/2012 | Sugizaki |
| 8,289,092 B2 | 10/2012 | Pomarico et al. |
| 8,297,121 B2 | 10/2012 | Quer et al. |
| 8,314,483 B2 | 11/2012 | Lin et al. |
| 8,324,047 B1 | 12/2012 | Yang |
| 8,347,717 B2 | 1/2013 | Seeger et al. |
| 8,350,346 B1 | 1/2013 | Huang et al. |
| 8,365,595 B2 | 2/2013 | Geiger et al. |
| 8,368,153 B2 | 2/2013 | Huang et al. |
| 8,372,677 B2 | 2/2013 | Mehregany |
| 8,375,789 B2 | 2/2013 | Prandi et al. |
| 8,384,134 B2 | 2/2013 | Daneman et al. |
| 8,390,173 B2 | 3/2013 | Yoshihara et al. |
| 8,395,252 B1 | 3/2013 | Yang |
| 8,395,381 B2 | 3/2013 | Lo et al. |
| 8,402,666 B1 | 3/2013 | Hsu et al. |
| 8,405,170 B2 | 3/2013 | Kohl et al. |
| 8,407,905 B1 | 4/2013 | Hsu et al. |
| 8,413,506 B2 | 4/2013 | Coronato et al. |
| 8,421,082 B1 | 4/2013 | Yang |
| 8,426,961 B2 | 4/2013 | Shih et al. |
| 8,432,005 B2 | 4/2013 | Yang et al. |
| 8,433,084 B2 | 4/2013 | Conti et al. |
| 8,445,307 B2 | 5/2013 | Yeh et al. |
| 8,459,093 B2 | 6/2013 | Donadel et al. |
| 8,459,110 B2 | 6/2013 | Cazzaniga et al. |
| 8,461,935 B2 | 6/2013 | McCraith et al. |
| 8,481,365 B2 | 7/2013 | Verhelijden et al. |
| 8,486,744 B2 | 7/2013 | Lin et al. |
| 8,487,444 B2 | 7/2013 | Law et al. |
| 8,490,461 B2 | 7/2013 | Sasaki et al. |
| 8,490,483 B2 | 7/2013 | Wrede et al. |
| 8,497,557 B2 | 7/2013 | Tanaka et al. |
| 8,508,039 B1 | 8/2013 | Nasiri et al. |
| 8,508,045 B2 | 8/2013 | Khan et al. |
| 8,513,747 B1 | 8/2013 | Huang et al. |
| 8,519,537 B2 | 8/2013 | Jeng et al. |
| 8,567,246 B2 | 10/2013 | Shaeffer et al. |
| 8,569,090 B2 | 10/2013 | Taheri |
| 8,587,077 B2 | 11/2013 | Chen |
| 8,593,036 B2 | 11/2013 | Boysel |
| 8,637,943 B1 | 1/2014 | Yang |
| 8,652,961 B1 | 2/2014 | Yang |
| 8,675,181 B2 | 3/2014 | Hall |
| 8,685,776 B2 | 4/2014 | LaFond et al. |
| 8,704,238 B2 | 4/2014 | Yang et al. |
| 8,748,206 B2 | 6/2014 | Horning |
| 8,759,926 B2 | 6/2014 | Fujii et al. |
| 8,810,030 B2 | 8/2014 | Geisberger |
| 8,826,514 B2 | 9/2014 | Papavasiliou et al. |
| 8,869,616 B1 | 10/2014 | Sridharamurthy et al. |
| 8,885,170 B2 | 11/2014 | Kilic et al. |
| 8,921,145 B2 | 12/2014 | Shu et al. |
| RE45,439 E | 3/2015 | Prandi et al. |
| 9,013,233 B2 | 4/2015 | Elmallah et al. |
| 9,046,541 B1 | 6/2015 | Kubena et al. |
| 9,061,891 B2 | 6/2015 | Supino et al. |
| 9,063,549 B1 | 6/2015 | Pennecot et al. |
| 9,085,455 B2 | 7/2015 | Cheng et al. |
| 9,309,106 B2 | 4/2016 | Boysel et al. |
| 9,340,414 B2 | 5/2016 | Yoneoka et al. |
| 9,409,768 B2 | 8/2016 | DeNatale et al. |
| 9,499,397 B2 | 11/2016 | Bowles et al. |
| 9,567,204 B2 | 2/2017 | Hung et al. |
| 9,594,128 B2 * | 3/2017 | Farghaly ................ G06F 30/17 |
| 9,751,754 B2 | 9/2017 | Kurashima et al. |
| 9,784,835 B1 | 10/2017 | Droz et al. |
| 9,837,935 B2 | 12/2017 | Johnson et al. |
| 9,869,754 B1 | 1/2018 | Campbell et al. |
| 9,945,950 B2 | 4/2018 | Newman et al. |
| 9,981,841 B2 | 5/2018 | Chu et al. |
| 10,365,131 B2 | 7/2019 | Grossman et al. |
| 10,392,244 B2 | 8/2019 | Hung et al. |
| 10,407,299 B2 | 9/2019 | Boysel |
| 10,598,689 B2 | 3/2020 | Zwahlen et al. |
| 10,768,065 B2 | 9/2020 | Boysel et al. |
| 10,793,421 B2 | 10/2020 | Rajasekaran et al. |
| 2001/0011994 A1 | 8/2001 | Morimoto et al. |
| 2002/0040602 A1 | 4/2002 | Okada |
| 2003/0094046 A1 | 5/2003 | Okada |
| 2003/0209075 A1 | 11/2003 | Okada |
| 2004/0052016 A1 | 3/2004 | Takagi et al. |
| 2004/0063239 A1 | 4/2004 | Yun et al. |
| 2004/0211258 A1 | 10/2004 | Geen |
| 2004/0224279 A1 | 11/2004 | Siemons |
| 2004/0231422 A1 | 11/2004 | Okada |
| 2005/0076719 A1 | 4/2005 | Jakobsen et al. |
| 2005/0166677 A1 | 8/2005 | Nasiri et al. |
| 2005/0210981 A1 | 9/2005 | Okada |
| 2005/0242991 A1 | 11/2005 | Montgomery et al. |
| 2006/0163453 A1 | 7/2006 | Hynes et al. |
| 2006/0179941 A1 | 8/2006 | Okada |
| 2006/0180896 A1 | 8/2006 | Martin et al. |
| 2006/0185428 A1 | 8/2006 | Combi et al. |
| 2006/0231521 A1 | 10/2006 | Chilcott |
| 2007/0180912 A1 | 8/2007 | Judy et al. |
| 2007/0214886 A1 | 9/2007 | Sheynblat |
| 2007/0273018 A1 | 11/2007 | Onozuka et al. |
| 2007/0279885 A1 | 12/2007 | Basavanhally et al. |
| 2007/0297631 A1 | 12/2007 | Miles |
| 2008/0098814 A1 | 5/2008 | Platt et al. |
| 2008/0283990 A1 * | 11/2008 | Nasiri ................ B81C 1/00238 |
| | | 257/684 |
| 2008/0289417 A1 | 11/2008 | Okada |
| 2009/0114016 A1 | 5/2009 | Nasiri et al. |
| 2009/0199637 A1 | 8/2009 | Sugiura et al. |
| 2009/0255335 A1 | 10/2009 | Fly et al. |
| 2009/0297770 A1 | 12/2009 | Koshida et al. |
| 2010/0084752 A1 | 4/2010 | Horning et al. |
| 2010/0132460 A1 | 6/2010 | Seeger et al. |
| 2010/0164086 A1 | 7/2010 | Noma et al. |
| 2010/0176466 A1 | 7/2010 | Fujii et al. |
| 2010/0182418 A1 | 7/2010 | Jess et al. |
| 2010/0218977 A1 | 9/2010 | Inoue et al. |
| 2010/0259130 A1 | 10/2010 | Eckstein et al. |
| 2010/0324366 A1 | 12/2010 | Shimotsu |
| 2011/0012248 A1 | 1/2011 | Reichenbach et al. |
| 2011/0016972 A1 | 1/2011 | Reinert |
| 2011/0030473 A1 | 2/2011 | Acar |
| 2011/0219876 A1 | 9/2011 | Kalnitsky et al. |
| 2011/0227173 A1 | 9/2011 | Seppala et al. |
| 2011/0228906 A1 | 9/2011 | Jaffray et al. |
| 2012/0006789 A1 | 1/2012 | DeNatale et al. |
| 2012/0042731 A1 | 2/2012 | Lin et al. |
| 2012/0048017 A1 | 3/2012 | Kempe |
| 2012/0091854 A1 | 4/2012 | Kaajakari |
| 2012/0137774 A1 | 6/2012 | Judy et al. |
| 2012/0142144 A1 | 6/2012 | Taheri |
| 2012/0227487 A1 | 9/2012 | Ayazi et al. |

(56) References Cited

U.S. PATENT DOCUMENTS

| | | |
|---|---|---|
| 2012/0261822 A1 | 10/2012 | Graham et al. |
| 2012/0272734 A1 | 11/2012 | Jeung et al. |
| 2012/0280594 A1 | 11/2012 | Chen et al. |
| 2012/0291547 A1 | 11/2012 | Kim et al. |
| 2012/0300050 A1 | 11/2012 | Korichi et al. |
| 2012/0326248 A1 | 12/2012 | Daneman et al. |
| 2013/0019680 A1 | 1/2013 | Kittilsland et al. |
| 2013/0100271 A1 | 4/2013 | Howes |
| 2013/0105921 A1 | 5/2013 | Najafi et al. |
| 2013/0115729 A1 | 5/2013 | Silverbrook et al. |
| 2013/0119492 A1 | 5/2013 | Feiertag et al. |
| 2013/0126992 A1 | 5/2013 | Ehrenpfordt et al. |
| 2013/0146994 A1 | 6/2013 | Kittilsland et al. |
| 2013/0147020 A1 | 6/2013 | Gonska et al. |
| 2013/0168740 A1 | 7/2013 | Chen |
| 2013/0181355 A1 | 7/2013 | Tsai et al. |
| 2013/0192363 A1 | 8/2013 | Loreck et al. |
| 2013/0192369 A1 | 8/2013 | Acar et al. |
| 2013/0210175 A1 | 8/2013 | Hoisington et al. |
| 2013/0221454 A1 | 8/2013 | Dunbar, III et al. |
| 2013/0241546 A1* | 9/2013 | Fu .................... G01R 33/02 324/259 |
| 2013/0253335 A1 | 9/2013 | Noto et al. |
| 2013/0270657 A1 | 10/2013 | Acar |
| 2013/0277773 A1 | 10/2013 | Bryzek et al. |
| 2013/0285165 A1 | 10/2013 | Classen et al. |
| 2013/0299924 A1 | 11/2013 | Weber et al. |
| 2013/0315036 A1 | 11/2013 | Paulson et al. |
| 2013/0341737 A1 | 12/2013 | Bryzek et al. |
| 2014/0007685 A1 | 1/2014 | Zhang et al. |
| 2014/0090469 A1 | 4/2014 | Comi et al. |
| 2014/0090485 A1 | 4/2014 | Feyh et al. |
| 2014/0091405 A1 | 4/2014 | Weber |
| 2014/0092460 A1 | 4/2014 | Schwedt et al. |
| 2014/0116135 A1 | 5/2014 | Cazzaniga et al. |
| 2014/0116136 A1 | 5/2014 | Coronato et al. |
| 2014/0124958 A1 | 5/2014 | Bowles et al. |
| 2014/0125325 A1* | 5/2014 | Ocak .................. G01R 33/0286 324/207.13 |
| 2014/0125359 A1 | 5/2014 | El-Gamal et al. |
| 2014/0137648 A1 | 5/2014 | Zolfagharkhani et al. |
| 2014/0138853 A1 | 5/2014 | Liu et al. |
| 2014/0162393 A1 | 6/2014 | Yang |
| 2014/0166463 A1 | 6/2014 | Jahnes et al. |
| 2014/0183729 A1 | 7/2014 | Bowles |
| 2014/0186986 A1 | 7/2014 | Shu et al. |
| 2014/0193949 A1 | 7/2014 | Wu |
| 2014/0203421 A1 | 7/2014 | Shu et al. |
| 2014/0210019 A1 | 7/2014 | Nasiri et al. |
| 2014/0227816 A1 | 8/2014 | Zhang et al. |
| 2014/0230548 A1 | 8/2014 | Coronato et al. |
| 2014/0231936 A1 | 8/2014 | Jahnes et al. |
| 2014/0231938 A1 | 8/2014 | Campedelli et al. |
| 2014/0260612 A1 | 9/2014 | Aono et al. |
| 2014/0260617 A1 | 9/2014 | Ocak et al. |
| 2014/0264650 A1 | 9/2014 | Liu et al. |
| 2014/0283605 A1 | 9/2014 | Baldasarre et al. |
| 2014/0287548 A1 | 9/2014 | Lin et al. |
| 2014/0291128 A1 | 10/2014 | Kwa |
| 2014/0311242 A1 | 10/2014 | Lee et al. |
| 2014/0311247 A1 | 10/2014 | Zhang et al. |
| 2014/0318906 A1 | 10/2014 | Deimerly et al. |
| 2014/0319630 A1 | 10/2014 | Conti et al. |
| 2014/0322854 A1 | 10/2014 | Nakatani et al. |
| 2014/0326070 A1 | 11/2014 | Neul et al. |
| 2014/0331769 A1 | 11/2014 | Fell |
| 2014/0339654 A1 | 11/2014 | Classen |
| 2014/0339656 A1 | 11/2014 | Schlarmann et al. |
| 2014/0349434 A1 | 11/2014 | Huang et al. |
| 2014/0352433 A1 | 12/2014 | Hammer |
| 2014/0353775 A1 | 12/2014 | Formosa et al. |
| 2014/0357007 A1 | 12/2014 | Cheng et al. |
| 2014/0370638 A1 | 12/2014 | Lee et al. |
| 2014/0374850 A1 | 12/2014 | Chen et al. |
| 2014/0374854 A1 | 12/2014 | Xue |
| 2014/0374917 A1 | 12/2014 | Weber et al. |
| 2014/0374918 A1 | 12/2014 | Weber et al. |
| 2015/0008545 A1 | 1/2015 | Quevy et al. |
| 2015/0115376 A1 | 4/2015 | Chen et al. |
| 2015/0191345 A1 | 7/2015 | Boysel et al. |
| 2015/0198493 A1 | 7/2015 | Kaelberer et al. |
| 2015/0260519 A1 | 9/2015 | Boysel et al. |
| 2015/0329351 A1* | 11/2015 | Cheng ................ B81C 1/00238 257/417 |
| 2015/0330782 A1 | 11/2015 | Johnson et al. |
| 2015/0353346 A1 | 12/2015 | Heuck et al. |
| 2015/0371390 A1 | 12/2015 | Gassner et al. |
| 2016/0003923 A1* | 1/2016 | Zieren .................... H01L 43/08 324/252 |
| 2016/0060104 A1 | 3/2016 | Chu et al. |
| 2016/0229684 A1 | 8/2016 | Boysel |
| 2016/0229685 A1 | 8/2016 | Boysel |
| 2016/0289063 A1* | 10/2016 | Ocak ...................... H01L 25/00 |
| 2016/0320426 A1 | 11/2016 | Boysel et al. |
| 2016/0327446 A1 | 11/2016 | Classen et al. |
| 2017/0030788 A1 | 2/2017 | Boysel et al. |
| 2017/0108336 A1 | 4/2017 | Boysel et al. |
| 2018/0074090 A1 | 3/2018 | Boysel |
| 2018/0327255 A1 | 11/2018 | Endean et al. |
| 2019/0064364 A1 | 2/2019 | Boysel et al. |
| 2020/0346920 A1 | 11/2020 | Endean et al. |
| 2021/0156756 A1 | 5/2021 | Boysel et al. |
| 2021/0198096 A1 | 7/2021 | Borca-Tasciuc et al. |

FOREIGN PATENT DOCUMENTS

| | | |
|---|---|---|
| EP | 1819012 A2 | 8/2007 |
| EP | 2410344 A2 | 1/2012 |
| EP | 2544302 A1 | 1/2013 |
| EP | 2693182 A1 | 2/2014 |
| EP | 2693183 A1 | 2/2014 |
| EP | 3019442 A1 | 5/2016 |
| JP | 2008-114354 A | 5/2008 |
| JP | 2008-132587 A | 6/2008 |
| JP | 2009-245877 A | 10/2009 |
| JP | 2011-194478 A | 10/2011 |
| JP | 2012-247192 A | 12/2012 |
| JP | 2013-030759 A | 2/2013 |
| JP | 2013-164285 A | 8/2013 |
| WO | 2008086530 A2 | 7/2008 |
| WO | 2009057990 A2 | 5/2009 |
| WO | 2011/151098 A2 | 12/2011 |
| WO | 2013116356 A1 | 8/2013 |
| WO | 2014122910 A1 | 8/2014 |
| WO | 2014159957 A1 | 10/2014 |
| WO | 2014177542 A1 | 11/2014 |
| WO | 2014184025 A1 | 11/2014 |
| WO | 2015003264 A1 | 1/2015 |
| WO | 2015013827 A1 | 2/2015 |
| WO | 2015013828 A1 | 2/2015 |
| WO | 2015/038078 A1 | 3/2015 |
| WO | 2015042700 A1 | 4/2015 |
| WO | 2015042701 A1 | 4/2015 |
| WO | 2015042702 A1 | 4/2015 |
| WO | 2015103688 A1 | 7/2015 |
| WO | 2015154173 A1 | 10/2015 |

OTHER PUBLICATIONS

Boysel et al., Development of a Single-Mass Five-Axis MEMS Motion Sensor. Virtus Advanced Sensors, Inc., 17 pages. (May 2009).

Boysel, White Paper Series: Virtus Sensor Technology. Virtus Advanced Sensors. Semicon Japan, 11 pages. Nov. 11, 2008.

Watanabe et al., SOI micromachined 5-axis motion sensor using resonant electrostatic drive and non-resonant capacitive detection mode. Sensor and Actuators A. 2006;130-131:116-123.

European Search Report for Application No. 14822259.9 dated Jan. 4, 2017.

International Search Report and Written Opinion for International Patent Application No. PCT/CA2014/050729, dated Nov. 3, 2014.

(56) References Cited

OTHER PUBLICATIONS

International Search Report and Written Opinion for International Patent Application No. PCT/CA2014/050902, dated Dec. 15, 2014.
International Search Report and Written Opinion for International Patent Application No. PCT/CA2014/050904, dated Dec. 1, 2014.
International Search Report and Written Opinion for International Patent Application No. PCT/CA2014/050910, dated Dec. 22, 2014.
International Search Report and Written Opinion for International Patent Application No. PCT/CA2014/051245, dated Feb. 25, 2015.
International Search Report and Written Opinion for International Patent Application No. PCT/CA2015/050018, dated Apr. 20, 2015.
International Search Report and Written Opinion for International Patent Application No. PCT/CA2015/050026, dated Apr. 27, 2015.
Chan et al., A Monolithically Integrated Pressure/Oxygen/Temperature Sensing SoC for Multimodality Intracranial Neuromonitoring. IEEE Journal of Solid-State Circuits. Nov. 2014;49(11):2449-61.
Merdassi et al., Capacitive MEMS absolute pressure sensor using a modified commercial microfabrication process. Microsystem Technol. Aug. 2017;23(8):3215-25. Published Online Jun. 20, 2016.
Merdassi et al., Design and Fabrication of 3-Axis Accelerometer Sensor Microsystem for Wide Temperature Range Applications Using Semi-Custom Process. Proc of SPIE. Mar. 2014;8973:89730O-1-89730O-12.
Merdassi et al., Design of 3-axis Capacitive Low-Gravity MEMS Accelerometer with Zero Cross-Axis Sensitivity in a Commercial Process. NSTI-Nanotech, www.nsti.org. Jan. 2013;2:185-188.
Merdassi et al., Wafer level vacuum encapsulated tri-axial accelerometer with low cross-axis sensitivity in a commercial MEMS Process. Sensors and Actuators A. Oct. 2015;236:25-37.
Merdassi, Ultra-Clean Wafer-Level Vacuum Encapsulated Intertial Using a Commercial Process. Department of Electrical and Computer Engineering McGill University, Montreal, Canada. A thesis submitted to McGill University in partial fulfillment of the Requirements of the degree of Doctor of Philosophy. 158 pages, Jul. 2016.
International Search Report and Written Opinion for Application No. PCT/CA2016/050303, dated Jun. 13, 2016. 7 pages.
International Search Report and Written Opinion for Application No. PCT/US2017/015393, dated Apr. 26, 2017. 17 pages.
International Search Report for Application No. PCT/CA2014/050730, dated Nov. 3, 2014. 3 pages.
International Search Report for Application No. PCT/CA2016/050031, dated Mar. 16, 2016. 3 pages.
Supplementary European Search Report for Application No. 14831791.0, dated Jun. 12, 2017, 8 pages.

\* cited by examiner

3D MEMS MAGNETOMETER AND ASSOCIATED METHODS

RELATED PATENT APPLICATIONS

This patent application is a 35 U.S.C. § 371 national stage filing of International Application No. PCT/CA2015/051259, filed Dec. 2, 2015, which in turn claims priority to U.S. Provisional Patent Application No. 62/089,502, filed Dec. 9, 2014, the above applications being incorporated herein by reference in their entirety.

TECHNICAL FIELD

The general technical field relates to micro-electro-mechanical systems (MEMS), and more particularly, to a MEMS magnetometer for measuring magnetic field and to associated measurement and manufacturing methods.

BACKGROUND

Micro-electro-mechanical system (MEMS) devices, in particular inertial sensors such as accelerometers and angular rate sensors or gyroscopes are being used in a steadily growing number of applications. Due to the significant increase in consumer electronics applications for MEMS sensors such as optical image stabilization (OIS) for cameras embedded in smart phones and tablet PCs, virtual reality systems and wearable electronics, there has been a growing interest in utilizing such technology for more advanced applications traditionally catered to by much larger, more expensive higher-grade non-MEMS sensors. Such applications include single- and multiple-axis devices for industrial applications, inertial measurement units (IMUs) for navigation systems and attitude heading reference systems (AHRS), control systems for unmanned air, ground and sea vehicles and for personal indoor and even GPS-denied navigation. These applications also may include healthcare/medical and sports performance monitoring and advanced motion capture systems for next generation virtual reality. These advanced applications often require lower bias drift and higher sensitivity specifications well beyond existing consumer-grade MEMS inertial sensors on the market. In order to expand these markets, it is desirable that higher performance specifications be developed and addressed by producing a low cost and small size sensor and/or MEMS inertial sensor-enabled systems.

Given that MEMS inertial sensors such as accelerometers and gyroscopes are typically much smaller than traditional mechanical gyroscopes, they tend to be subject to higher mechanical noise and drift. Also, since position and attitude are calculated by integrating the acceleration and angular rate data, respectively, noise and drift generally lead to growing errors. Consequently, for applications requiring high accuracy, such as navigation, it is generally desirable to augment the six-degree-of-freedom (6DOF) inertial capability of MEMS motion sensors (i.e., three axes of linear acceleration and three axes of angular rotation) with other position- and/or orientation-dependent measurements. In many applications, such sensor fusion is necessary for better results.

Recently, three-axis magnetic field sensors have been added to 3DOF and 6DOF MEMS inertial sensors to provide a compass function by measuring the sensor's orientation relative to the Earth's magnetic field. Typically, these magnetometers are hybridly integrated with the inertial sensor. That is, a separately purchased or fabricated magnetometer chip is adhesively attached to an inertial sensor chip, sense electronics integrated circuit (IC), or package substrate and wire bonded before packaging seal. Such a hybrid configuration generally introduces additional material (e.g., magnetometer chip, adhesive, bond wires) and fabrication (e.g., die attach and wire bonding) costs. Also, many magnetometers are designed so that they can detect a component of the magnetic field only along one axis. Thus, three magnetometers are often used to sense or measure the three vector components of a magnetic field, which in some implementations can prove undesirable, impractical and/or too costly. Accordingly, various challenges still exist in the development of three-axis MEMS magnetometers for integration with MEMS inertial sensors.

SUMMARY

In accordance with an aspect, there is provided a three-dimensional (3D) micro-electro-mechanical system (MEMS) magnetometer for measuring first, second and third magnetic field components respectively along mutually orthogonal first, second and third axes, the 3D MEMS magnetometer including:
  a MEMS wafer having opposed top and bottom sides, the MEMS wafer including a frame structure and current-carrying first, second and third magnetic field transducers;
  a top cap wafer and a bottom cap wafer respectively bonded to the top side and the bottom side of the MEMS wafer, the top cap wafer, the bottom cap wafer and the MEMS wafer being electrically conductive and stacked one on top of the other along the third axis, the top cap wafer, the bottom cap wafer and the frame structure together forming one or more cavities, each cavity enclosing at least one of the first, second and third magnetic field transducers, each magnetic field transducer being enclosed in one of the one or more cavities; and
  first, second and third electrode assemblies, the first and second electrode assemblies each being formed in either or both of the top and bottom cap wafers, each of the first, second and third electrode assemblies being configured to sense an output of a respective one of the first, second and third magnetic field transducers induced by a respective one of the first, second and third magnetic field components.

In some embodiments, each of the first, second and third electrode assemblies is configured to capacitively sense a displacement of the respective one of the first, second and third magnetic field transducers in response to a Lorentz force produced by the respective one of the first, second and third magnetic field components.

In some embodiments, the first and second magnetic field transducers are suspended from the frame structure, configured to carry a current along the second and first axes, respectively, and deflectable along the third axis in response to the Lorentz force produced by the first and second magnetic field components, respectively.

In some embodiments, the first magnetic field transducer includes a first pair of elongated transducer elements extending along the second axis, and the second magnetic field transducer includes a second pair of elongated transducer elements extending along the first axis.

In some embodiments, the first pair of elongated transducer elements are configured to carry equal and opposite currents; the first electrode assembly forms a first pair of capacitors with the first pair of elongated transducer elements and is configured to measure a first differential capacitance between the first pair of capacitors, the first differential capacitance being indicative of a magnitude of the first magnetic field component; the second pair of elongated transducer elements are configured to carry equal and opposite currents; and the second electrode assembly forms a second pair of capacitors with the second pair of elongated transducer elements and is configured to measure a second differential capacitance between the second pair of capacitors, the second differential capacitance being indicative of a magnitude of the second magnetic field component.

In some embodiments, each of the first and second electrode assemblies includes one or more sense electrodes, each sense electrode being laterally bordered by an insulating closed-loop trench extending along the third axis and at least partially into the either one of the top and bottom cap wafers.

In some embodiments, the third magnetic field transducer includes a stationary transducer element and a movable transducer element respectively fixed and displaceable in a plane perpendicular to the third axis relative to the frame structure, the movable transducer element being configured to carry a current in this plane.

In some embodiments, the third electrode assembly is configured to capacitively sense a relative motion between the stationary transducer element and the movable transducer element, this relative motion being indicative of a magnitude of the third magnetic field component.

In some embodiments, the third electrode assembly forms an interdigitated capacitive structure including at least one first set of conductive digits provided on the stationary transducer element and at least one second set of conductive digits provided on the movable transducer element, the at least one first set and the at least one second set of conductive digits being interlocked and capacitively coupled with each other.

In some embodiments, the third electrode assembly is formed in the MEMS wafer.

In some embodiments, the 3D MEMS magnetometer further includes one or more electrical contacts formed on an outer side of the top cap wafer; and an electrically conductive path extending across and through the top cap wafer to electrically connect the one or more electrical contacts to the third electrode assembly.

In some embodiments, the top cap wafer, the bottom cap wafer and the MEMS wafer are each made at least partially of silicon-based material.

In some embodiments, the MEMS wafer is a silicon-on-insulator wafer including a MEMS device layer bonded to the top cap wafer, a MEMS handle layer bonded to the bottom cap wafer, and a MEMS insulating layer interposed between the MEMS device layer and the MEMS handle layer.

In some embodiments, at least one of the top cap wafer and the bottom cap wafer is a silicon-on-insulator wafer including a cap device layer, a cap handle layer, and a cap insulating layer interposed therebetween.

In some embodiments, at least one of the one or more cavities is a hermetically sealed vacuum cavity.

In some embodiments, the one or more cavities consist of a single cavity enclosing the first, second and third magnetic field transducers.

In some embodiments, the first, second and third magnetic field transducers form respective first, second and third resonant structures having associated resonant frequencies, each of the first, second and third magnetic field transducers configured to carry current at a frequency matching the resonant frequency associated thereto.

According to another aspect, there is provided a 3D MEMS magnetometer for measuring first, second and third magnetic field components respectively along mutually orthogonal first, second and third axes, the 3D MEMS magnetometer including:
  a MEMS wafer having opposed top and bottom sides, the MEMS wafer including a frame structure and current-carrying first, second and third magnetic field transducers, the MEMS wafer being a silicon-on-insulator wafer with a MEMS device layer, a MEMS handle layer, and a MEMS insulating layer interposed between the MEMS device layer and the MEMS handle layer, the first, second and third magnetic field transducers being formed in the MEMS device layer;
  a top cap wafer and a bottom cap wafer respectively bonded to the MEMS device layer and the MEMS handle layer, the top cap wafer, the bottom cap wafer and the MEMS wafer being electrically conductive and stacked one on top of the other along the third axis, the top cap wafer, the bottom cap wafer and the frame structure together forming one or more cavities, each cavity enclosing at least one of the first, second and third magnetic field transducers, each magnetic field transducer being enclosed in one of the one or more cavities; and
  first, second and third electrode assemblies, the first and second electrode assemblies each being formed in the top cap wafer, each of the first, second and third electrode assemblies being configured to sense an output of a respective one of the first, second and third magnetic field transducers induced by a respective one of the first, second and third magnetic field components.

In some embodiments, the top cap wafer is a silicon-on-insulator wafer including a top cap device layer bonded to the MEMS device layer, a top cap handle layer, and a top cap insulating layer interposed between the top cap device layer and the top cap handle layer.

In some embodiments, each of the first and second electrode assemblies is etched in the top cap device layer.

In some embodiments, the top cap wafer includes recesses formed therein and defining capacitor gaps between the first electrode assembly and the first magnetic field transducer, and between the second electrode assembly and the second magnetic field transducer.

In some embodiments, the 3D MEMS magnetometer further includes:
  at least one first electrical contact formed on an outer side of the top cap handle layer, and a first electrically conductive path extending across and successively through the top cap handle, insulating and device layers to electrically connect the at least one first electrical contact to the first electrode assembly; and
  at least one second electrical contact formed on an outer side of the top cap handle layer, and a second electrically conductive path extending across and successively through the top cap handle, insulating and device layers to electrically connect the at least one second electrical contact to the second electrode assembly.

In some embodiments, the third electrode assembly is formed in the MEMS device layer.

In some embodiments, the 3D MEMS magnetometer further includes at least one third electrical contacts formed on an outer side of the top cap wafer; and an third electrically conductive path extending across and through the top cap wafer to electrically connect the at least one third electrical contacts to the third electrode assembly.

In some embodiments, each of the first, second and third electrode assemblies is configured to capacitively sense a displacement of the respective one of the first, second and third magnetic field transducers in response to a Lorentz force produced by the respective one of the first, second and third magnetic field components.

In some embodiments, the first and second magnetic field transducers are suspended from the frame structure, configured to carry a current along the second and first axes, respectively, and deflectable along the third axis in response to the Lorentz force produced by the first and second magnetic field components, respectively.

In some embodiments, the first magnetic field transducer includes a first pair of elongated transducer elements extending along the second axis, and the second magnetic field transducer includes a second pair of elongated transducer elements extending along the first axis.

In some embodiments, the first pair of elongated transducer elements are configured to carry equal and opposite currents; the first electrode assembly forms a first pair of capacitors with the first pair of elongated transducer elements and is configured to measure a first differential capacitance between the first pair of capacitors, the first differential capacitance being indicative of a magnitude of the first magnetic field component; the second pair of elongated transducer elements are configured to carry equal and opposite currents; and the second electrode assembly forms a second pair of capacitors with the second pair of elongated transducer elements and is configured to measure a second differential capacitance between the second pair of capacitors, the second differential capacitance being indicative of a magnitude of the second magnetic field component.

In some embodiments, each of the first and second electrode assemblies includes one or more sense electrodes, each sense electrode being laterally bordered by an insulating closed-loop trench extending along the third axis and at least partially into the top cap wafer.

In some embodiments, the third magnetic field transducer includes a stationary transducer element and a movable transducer element respectively fixed and displaceable in a plane perpendicular to the third axis, the movable transducer element being configured to carry a current along at this plane.

In some embodiments, the third electrode assembly is configured to capacitively sense a relative motion between the stationary transducer element and the movable transducer element, this relative motion being indicative of a magnitude of the third magnetic field component.

In some embodiments, the third electrode assembly forms an interdigitated capacitive structure including at least one first set of conductive digits provided on the stationary transducer element and at least one second set of conductive digits provided on the movable transducer element, the at least one first set and the at least one second set of conductive digits being interlocked and capacitively coupled with each other.

In some embodiments, at least one of the one or more cavities is a hermetically sealed vacuum cavity.

In some embodiments, the one or more cavities consist of a single cavity enclosing the first, second and third magnetic field transducers.

According to another aspect, there is provided a 3D MEMS magnetometer for measuring first, second and third magnetic field components respectively along mutually orthogonal first, second and third axes, the 3D MEMS magnetometer including:
  a frame structure;
  a first magnetic field transducer suspended from the frame structure, configured to carry a current along the second axis, and deflectable along the third axis;
  a first electrode assembly capacitively coupled with the first magnetic field transducer, the first electrode assembly being configured to sense, as a first capacitance, a deflection of the first magnetic field transducer along the third axis caused by a Lorentz force resulting from an interaction between the first current and the first magnetic field component, the first capacitance being indicative of the first magnetic field component;
  a second magnetic field transducer suspended from the frame structure, configured to carry a current along the first axis, and deflectable along the third axis;
  a second electrode assembly capacitively coupled with the second magnetic field transducer, the second electrode assembly being configured to sense, as a second capacitance, a deflection of the second magnetic field transducer along the third axis caused by a Lorentz force resulting from an interaction between the second current and the second magnetic field component, the second capacitance being indicative of the second magnetic field component;
  a third magnetic field transducer including a stationary transducer element and a movable transducer element respectively fixed and displaceable in a plane perpendicular to the third axis relative to the frame structure, the movable transducer element being configured to carry a current in this plane; and
  a third electrode assembly configured to sense, as a third capacitance, a relative motion between the stationary and movable transducer elements caused by a Lorentz force resulting from an interaction between the third current and the third magnetic field component, the third capacitance being indicative of the third magnetic field component.

According to another aspect, there is provided a method for measuring first, second and third magnetic field components along mutually orthogonal first, second and third axes, respectively, the method including:
  providing a 3D MEMS magnetometer including a MEMS wafer having opposed top and bottom sides, the MEMS wafer including a frame structure and current-carrying first, second and third magnetic field transducers, a top cap wafer and a bottom cap wafer respectively bonded to the top side and the bottom side of the MEMS wafer, the top cap wafer, the bottom cap wafer and the MEMS wafer being electrically conductive and stacked one on top of the other along the third axis, the top cap wafer, the bottom cap wafer and the frame structure together forming one or more cavities, each cavity enclosing at least one the first, second and third magnetic field transducers, each magnetic field transducer being enclosed in one of the one or more cavities;
  flowing current into each of the first, second and third magnetic field transducers; and
  sensing an output of each the first, second and third magnetic field transducers induced by and indicative of a respective one of the first, second and third magnetic field components;
In some embodiments, the method includes:
  flowing a first current into the first magnetic field transducer, the first magnetic field transducer being deflectable along the third axis and configured to carry the first current along the second axis;

sensing, as a first capacitance, a deflection of the first magnetic field transducer along the third axis in response to a first Lorentz force resulting from an interaction between the first current and the first magnetic field component, the first capacitance being indicative of a magnitude of the first magnetic field component;

flowing a second current into the second magnetic field transducer, the second magnetic field transducer being deflectable along the third axis and configured to carry the second current along the first axis;

sensing, as a second capacitance, a deflection of the second magnetic field transducer along the third axis in response a second Lorentz force resulting from an interaction between the second current and the second magnetic field component, the second capacitance being indicative of a magnitude of the second magnetic field component;

flowing a third current into a movable transducer element of the third magnetic field transducer, the movable transducer element being displaceable relative to a stationary transducer element of the third magnetic field transducer and configured to carry the third current in a plane perpendicular to the third axis; and sensing, as a third capacitance, a relative motion between the stationary and movable transducer elements in this plane, the third capacitance being indicative of a magnitude of the third magnetic field component.

According to another aspect, there is provided a method of manufacturing and packaging 3D MEMS magnetometer as described herein with an integrated circuit (IC) at the wafer level.

Other features and advantages of the embodiments of the present invention will be better understood upon reading of preferred embodiments thereof with reference to the appended drawings.

Figure 1:
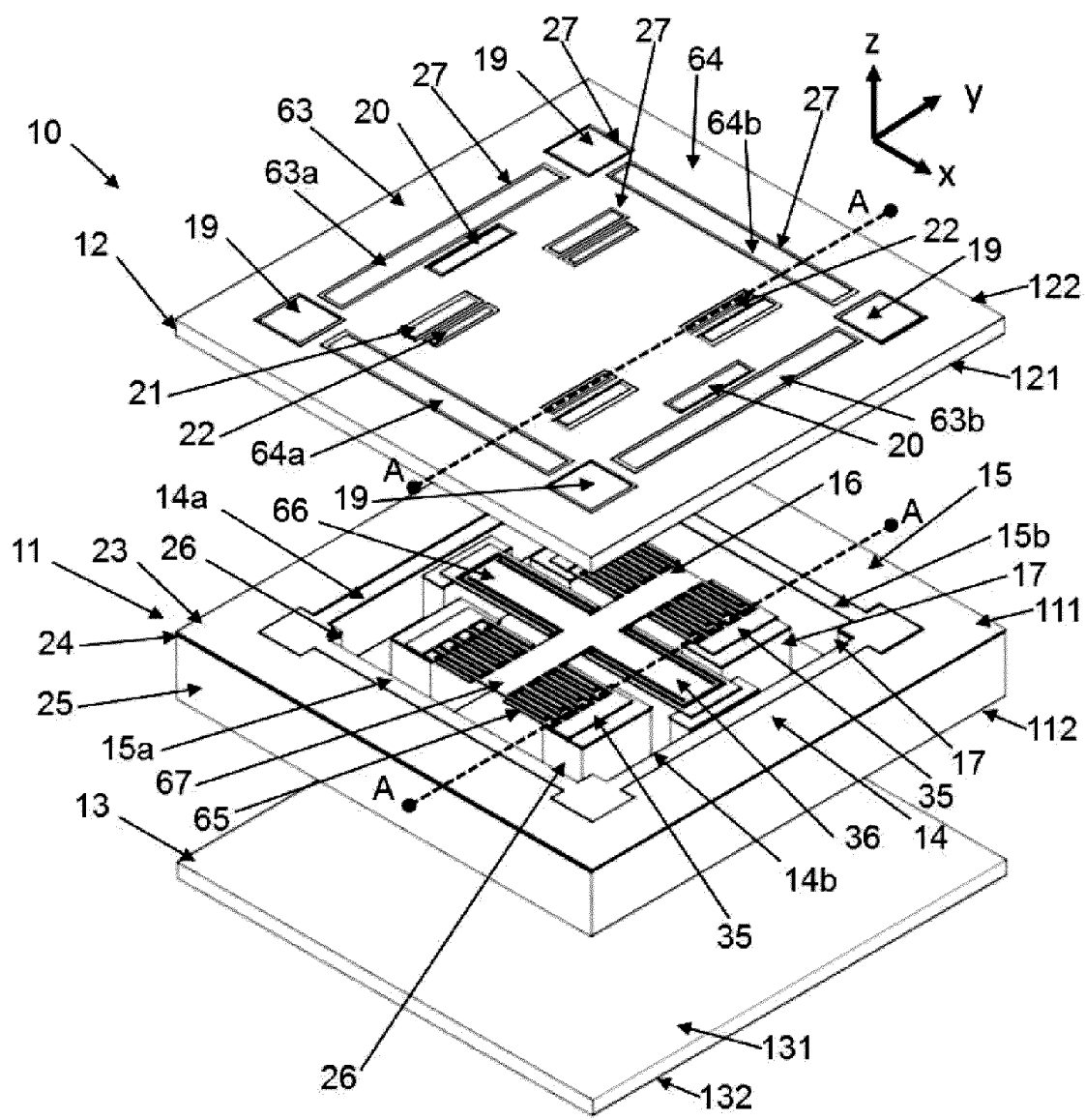
FIG. 1 is a partially exploded perspective view of a 3D MEMS magnetometer, in accordance with an embodiment.

It should be noted that the appended drawings illustrate only exemplary embodiments of the invention, and are therefore not to be construed as limiting of its scope, for the invention may admit to other equally effective embodiments.

DETAILED DESCRIPTION

In the following description, similar features in the drawings have been given similar reference numerals, and, in order to preserve clarity in the drawings, some reference numerals may be omitted when they were already identified in a preceding figure. It should also be understood that the elements of the drawings are not necessarily depicted to scale, since emphasis is placed upon clearly illustrating the elements and structures of the present embodiments. Also, while some of the drawings may illustrate a single chip, it will be appreciated that the single chip can be one of many chips fabricated in parallel on a single wafer. Consequently, the terms "wafer" and "silicon wafer" may sometimes be used in the present description to refer to a single chip.

The present description generally relates to a three-dimensional (3D) micro-electro-mechanical system (MEMS) device implemented as a magnetometer for measuring a magnetic field along three mutually orthogonal axes, and to an associated magnetic field measurement method. The present description also generally relates to a method of manufacturing and packaging a 3D MEMS magnetometer with an integrated circuit (IC) at the wafer level.

As used herein, the term "magnetometer" is understood to refer to any device, instrument or element which can measure or sense the magnitude and/or direction of an external or ambient magnetic field, whether the Earth's magnetic field or an applied magnetic field. In the embodiments described herein, the MEMS magnetometer can be a three-axis MEMS magnetometer, that is, a magnetometer capable of measuring the components of an external magnetic field vector along three mutually orthogonal axes.

Also, the term "three-dimensional" and its acronym "3D" are used to characterize the implementation of the MEMS magnetometer described herein in a 3D MEMS chip architecture in which elements (e.g., mechanical and electrical elements) may be either coplanar (e.g., the comb capacitor forming the third magnetic field transducer in the embodiment of FIG. 1) or non-coplanar (e.g., the plate capacitors formed between the first and second magnetic field transducers and their associated first and second electrode assemblies in the embodiment of FIG. 1). The term "three-dimensional" and its acronym "3D" also refers to the fact that in the MEMS magnetometer described herein, electrical signals can be routed in three dimensions, that is, not only in the plane of the MEMS magnetometer, but also across its thickness to allow electrical connections to be established between the various mechanical and electrical elements of the MEMS magnetometer and electrical contacts on its outer top and/or bottom sides.

In some implementations, the 3D MEMS magnetometer may be integrated into a MEMS 3D system (3DS) chip, which includes a MEMS and an integrated circuit (IC). In some of these implementations, the 3D MEMS magnetometer may advantageously be integrated into the MEMS 3DS chip with no or minimal increase in terms of footprint, height and packing complexity compared to conventional MEMS magnetometers.

It should be noted that while the embodiment described above provides a three-axis MEMS magnetometer, in other embodiments, a single-axis or a two-axis MEMS magnetometer having a similar stacked 3D wafer structure could also be implemented without departing from the scope of the present invention.

Embodiments of a 3D MEMS Magnetometer

Figure 2A:
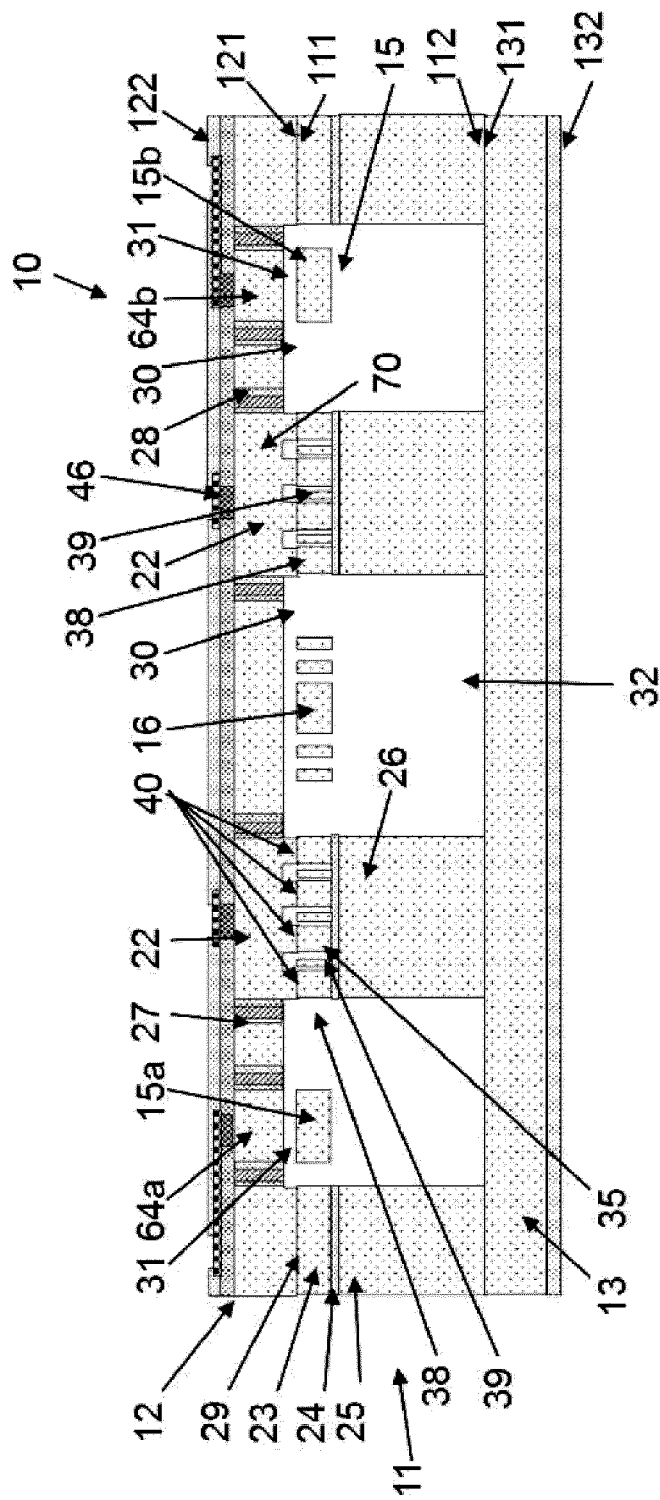
FIG. 2A is a cross-sectional side view of the 3D MEMS magnetometer of FIG. 1, taken along section line AA, the 3D MEMS magnetometer being provided without bottom cap feedthroughs.

In accordance with an aspect, there is provided a 3D MEMS magnetometer 10 for measuring first, second and third magnetic field components respectively along mutually orthogonal first, second and third axes, an exemplary embodiment of which is illustrated in FIGS. 1 and 2A. Broadly described, the three-axis MEMS magnetometer 10 includes a MEMS wafer 11 having a frame structure 17 and current-carrying first, second and third magnetic field transducers 14, 15, 16, a top cap wafer 12, a bottom cap wafer 13, and first, second and third electrode assemblies 63, 64, 65. Each of the first, second and third electrode assemblies 63, 64, 65 is configured to sense an output of a respective one of the first, second and third magnetic field transducers 14, 15, 16 induced by a respective one of the first, second and third magnetic field components. Each of these components will be described in greater detail below.

It is noted that for definiteness, the first, second and third axes will be designated and referred to herein as the x, y and z axes, respectively. In particular, in some instances, the x and y axes may be referred to as "in-plane", "lateral" or "horizontal" directions, while the z axis may be referred to as an "out-of-plane", "transverse" or "vertical" direction. Similarly, the first, second and third magnetic field components will be referred to herein as the x, y and z magnetic field components and be designated by the symbols $B_x$, $B_y$ and $B_z$, respectively.

Also, throughout the present description, terms such as "top" and "bottom", "above" and "below", "over" and "under", "upper" and "lower", and other like terms indicating the position of one element with respect to another element are used herein for ease and clarity of description, as illustrated in the figures, and should not be considered limitative. It will be understood that such spatially relative terms are intended to encompass different orientations of the MEMS magnetometer in use or operation, in addition to the orientation exemplified in the figures. In particular, the terms "top" and "bottom" are used to facilitate reading of the description, and those skilled in the art of MEMS will readily recognize that, when in use, the MEMS magnetometer can be placed in different orientations such that elements referred to herein as being "top elements" and "bottom elements", for example the top cap wafer and the bottom cap wafer, can be positioned upside down in certain configurations.

It will further be understood that the terms "over" and "under" and "above" and "below" in specifying the spatial relationship of one element with respect to another element denotes that the two elements are one on top of the other, either in direct contact or separated by one or more intervening elements.

Referring to FIGS. 1 and 2A, the MEMS magnetometer 10 includes a MEMS wafer 11 having opposed top and bottom sides 111, 112. The MEMS magnetometer also includes a top cap wafer 12 and a bottom cap wafer 13 respectively bonded to the top side 111 and the bottom side 112 of the MEMS wafer 11. The MEMS wafer 11, the top cap wafer 12 and the bottom cap wafer 13 are electrically conductive and may each be made at least partially of silicon-based material. The three wafers 11, 12, 13 are stacked one on top of the other along the third axis, that is, along the z axis in FIGS. 1 and 2A In the embodiment of FIGS. 1 and 2A, the MEMS wafer 11 is a silicon-on-insulator (SOI) wafer including a MEMS device layer 23, a MEMS handle layer 25, and a MEMS insulating layer 24 sandwiched between the MEMS device layer 23 and the MEMS handle layer 25. In particular, the MEMS device layer 23, the MEMS insulating layer 24 and the MEMS handle layer 25 may consist of a thin single crystal silicon (SCS) layer (e.g., 1-100 microns), a thin buried oxide layer (e.g., 1-2 microns), and a thick silicon layer (e.g., 100-700 microns).

In the illustrated embodiment, the top cap wafer 12 is bonded to and in electrical contact with selected portions of the MEMS device layer 23, while the bottom cap wafer 13 is bonded to and in electrical contact with selected portions of the MEMS handle layer 25. Meanwhile, the MEMS insulating layer 24 acts to insulate the top portion of the MEMS magnetometer 10 from the bottom portion. However, referring to FIG. 2B, in some embodiments, SOI conducting shunts 33 may be formed through the MEMS insulating layer 24 to establish electrical connections between the MEMS device layer 23 and the MEMS handle layer 25 at desired places.

It will be understood that SOI technology can be advantageous in some applications because the thickness of the MEMS device layer 23 can be well-controlled and separated from the MEMS handle layer 25 by the MEMS insulating layer 24. Of course, in other implementations, the MEMS wafer 11 need not be based on SOI technology.

Returning to the embodiment of FIGS. 1 and 2A, the top cap wafer 12 and the bottom cap wafer 13 are constructed using conducting wafers (e.g., standard silicon wafers). Alternatively, in other embodiments, at least one of top and bottom cap wafers 12, 13 may be an SOI wafer including a cap device layer, a cap handle layer, and a cap insulating layer interposed therebetween. By way of example, in the embodiment of FIGS. 18A to 18C, the top cap wafer 12 is an SOI wafer including a top cap device layer 60 bonded to the MEMS device layer, a top cap handle layer 62, and a top cap insulating layer 61 interposed between the top cap device layer 60 and the top cap handle layer 62.

It is to be noted that, in general, the top and bottom cap wafers may be patterned with different features penetrating partially or entirely the thickness of the wafer and delineated by insulating channels. Such features can include, without being limited to, electrodes, vertical electrical feedthroughs, electrical leads, and bonding pads. Examples of such features will be discussed below. In some embodiments, an insulating layer may be deposited on the outer side of the cap wafers to mechanically protect them and to electrically insulate their inner features from the environment. The insulating layer may contain openings for electrical contacts to certain of the features in the cap wafers. In such a case, the electrical contacts may be filled with a conducting material to form electrical connections to the features as well as electrical bond pads.

Figure 18A:
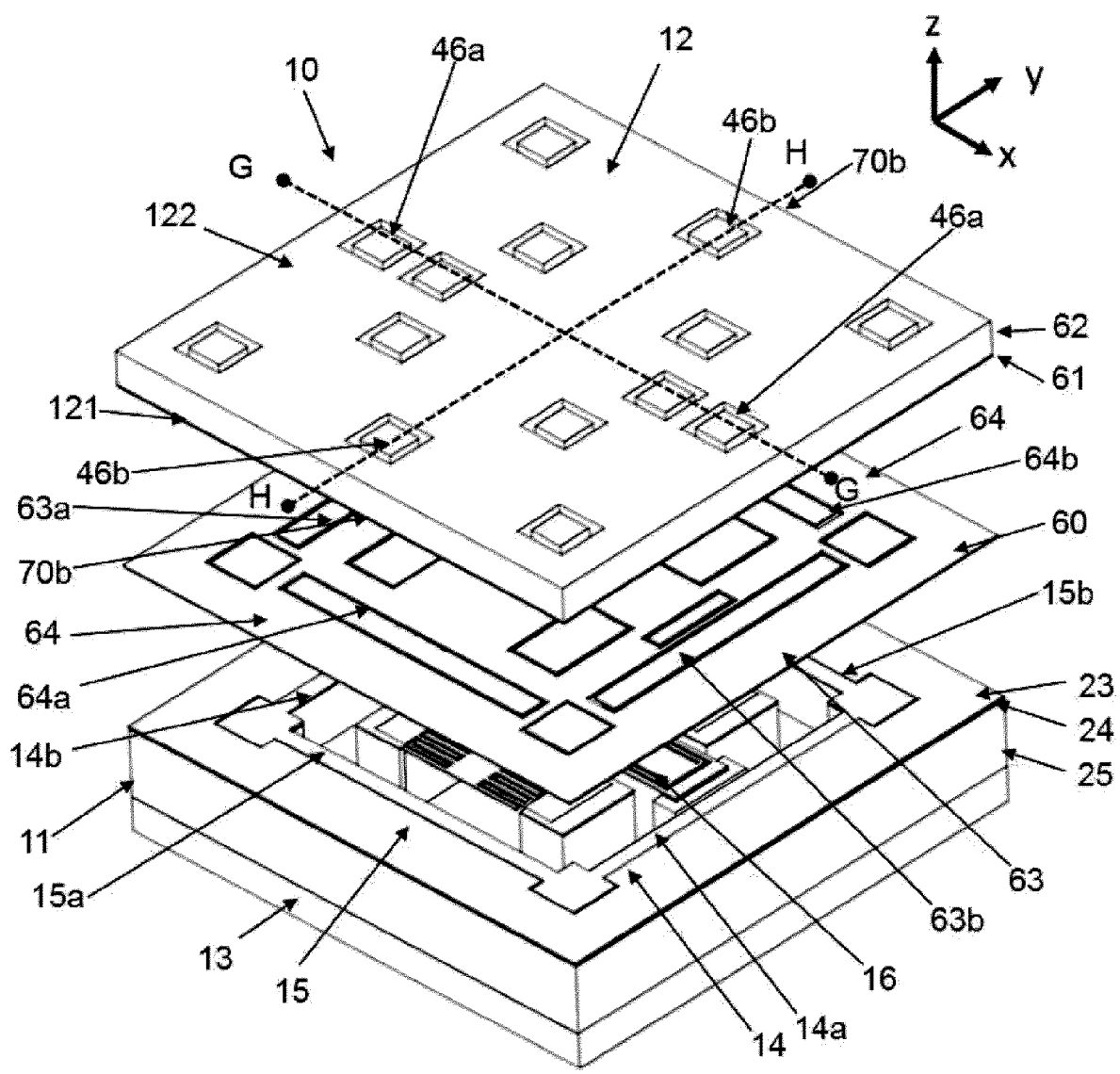
FIG. 18A is a partially exploded perspective view of a 3D MEMS magnetometer, in accordance with another embodiment, wherein the top cap wafer is an SOI wafer.
Figure 18B:
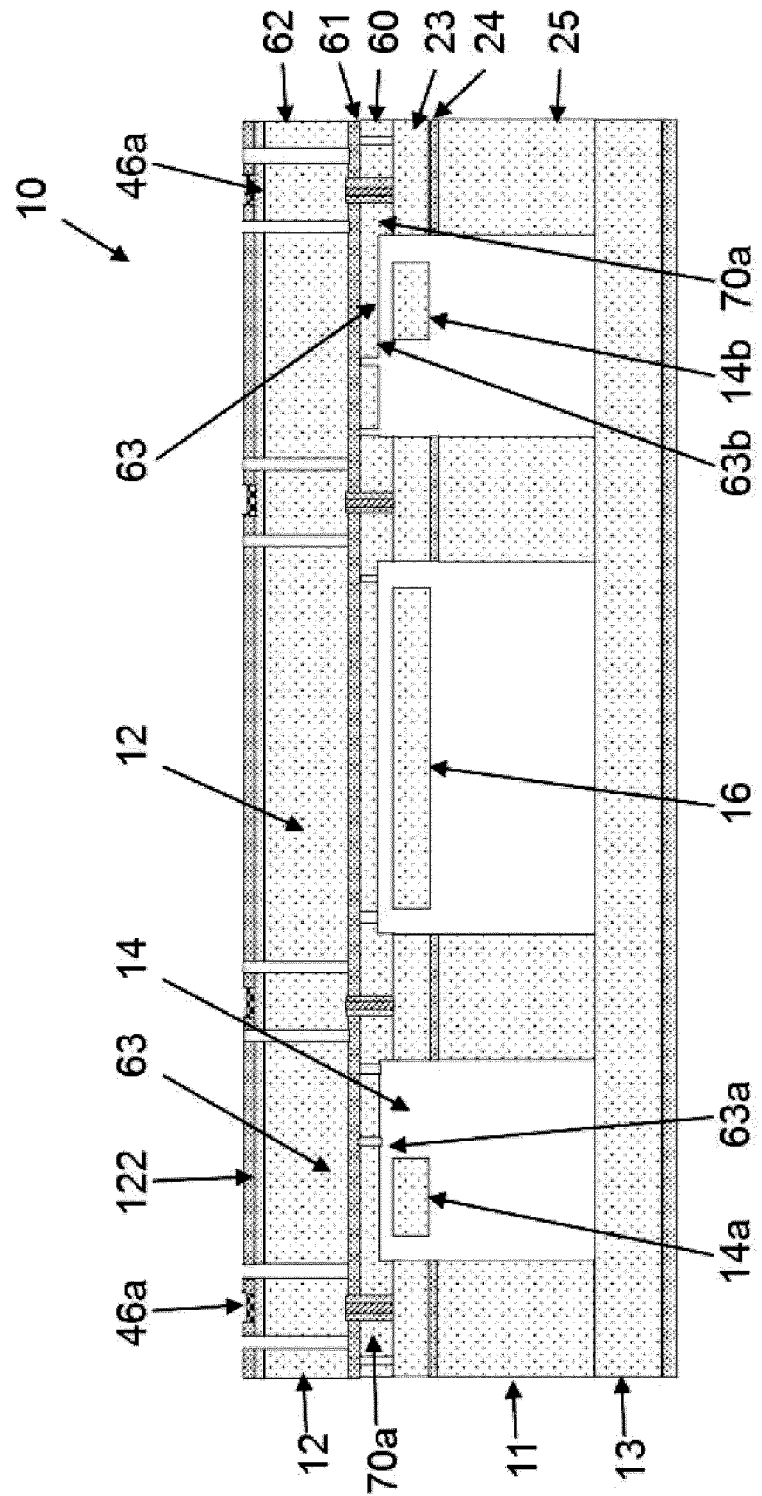
FIG. 18B is a cross-sectional side view of the 3D MEMS magnetometer of FIG. 18A, taken along section line GG.
Figure 18C:
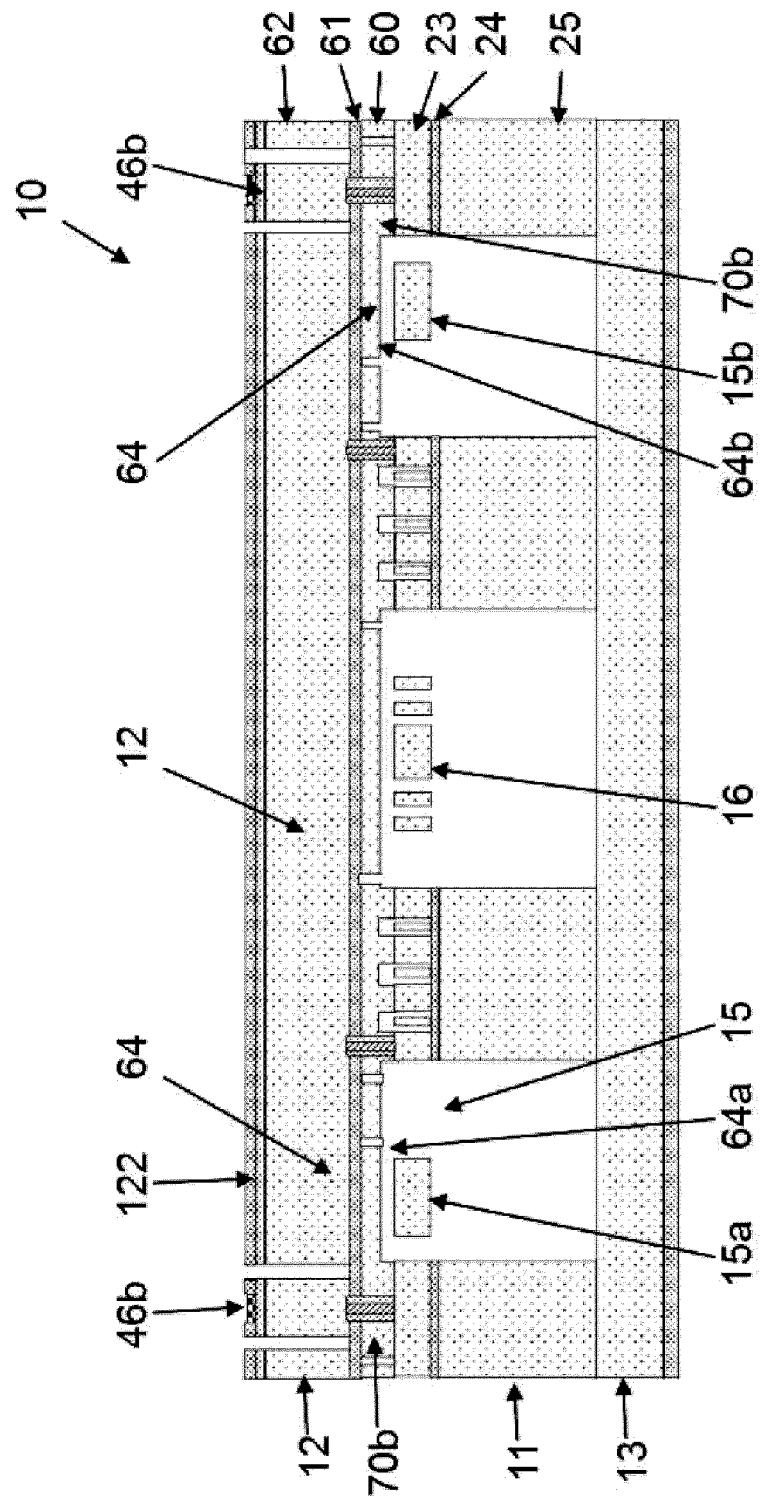
FIG. 18C is another cross-sectional side view of the 3D MEMS magnetometer of FIG. 18A, taken along section line HH.

By way of example, in the embodiment of FIGS. 18A to 18C, the top cap wafer 12 is an SOI wafer and may include at least one first electrical contact 46a formed on an outer side of the top cap handle layer 62 (corresponding to the outer side 122 of the top cap wafer 12), and a first electrically conductive path 70a extending across and successively through the top cap handle, insulating and device layers 62, 61, 60 to electrically connect the at least one first electrical contact 46a to the first electrode assembly 63. Likewise, the top cap wafer 12 may also include at least one second electrical contact 46b formed on an outer side of the top cap handle layer 62 (corresponding to the outer side 122 of the top cap wafer 12), and a second electrically conductive path 70b extending across and successively through the top cap handle, insulating and device layers 62, 61, 60 to electrically connect the at least one first electrical contact 46b to the second electrode assembly 64.

Referring back to FIGS. 1 and 2A, the MEMS wafer 11 includes a frame structure 17 and current-carrying first, second and third magnetic field transducers 14, 15, 16. In the illustrated embodiment, the first, second and third magnetic field transducers 14, 15, 16 are formed in the MEMS device layer 23, but this need not be the case in other embodiments.

As used herein, the term "frame structure" is intended to refer broadly to the overall structure etched, formed or otherwise provided in the MEMS wafer 11 that surrounds and/or supports the first, second and third magnetic field transducers. The frame structure 17 generally includes at least the peripheral edge portion of each MEMS chip, and can include structural elements such as posts extending along the third axis z. In some implementations, the frame structure 17 provides the surfaces to which the caps are bonded, together forming the hermetic chamber surrounding the movable elements of the magnetic field transducers 14, 15, 16. In particular, in some embodiments, the frame structure 17 of the MEMS wafer 11 also provides a reference frame relative to which the magnetic field transducers 14, 15, 16 or elements thereof can move.

Referring still to FIGS. 1 and 2A, in the illustrated embodiment, the top cap wafer 12, the bottom cap wafer 13 and the frame structure 50 together form one or more cavities 32. Each cavity 32 encloses at least one of the first, second and third magnetic field transducers 14, 15, 16, with each magnetic field transducer being enclosed in a cavity. In the embodiment of FIGS. 1 and 2A, a single cavity 32 is provided that encloses the three magnetic field transducers 14, 15, 16. The single cavity 32 may be a hermetically sealed cavity that can contain an ambient gas at any desired or required pressure. In some embodiments, the single cavity 32 can be a vacuum cavity sealed a pressure of less than about 100 Pa.

It is to be noted that existing MEMS magnetometers (and most existing MEMS devices in general) are generally fabricated either on non-functional substrates or in layers pre-bonded to CMOS substrates. In either case in order to provide a vacuum ambient for the MEMS magnetometer additional wire bonding and vacuum packaging steps are required. These steps introduce additional size, cost and complexity to resulting device. In contrast, embodiments of the 3D MEMS magnetometer described herein can provide for electrical connections and vacuum or hermetic sealing within a single MEMS chip structure, saving processing steps, size and/or cost.

Figure 19A:
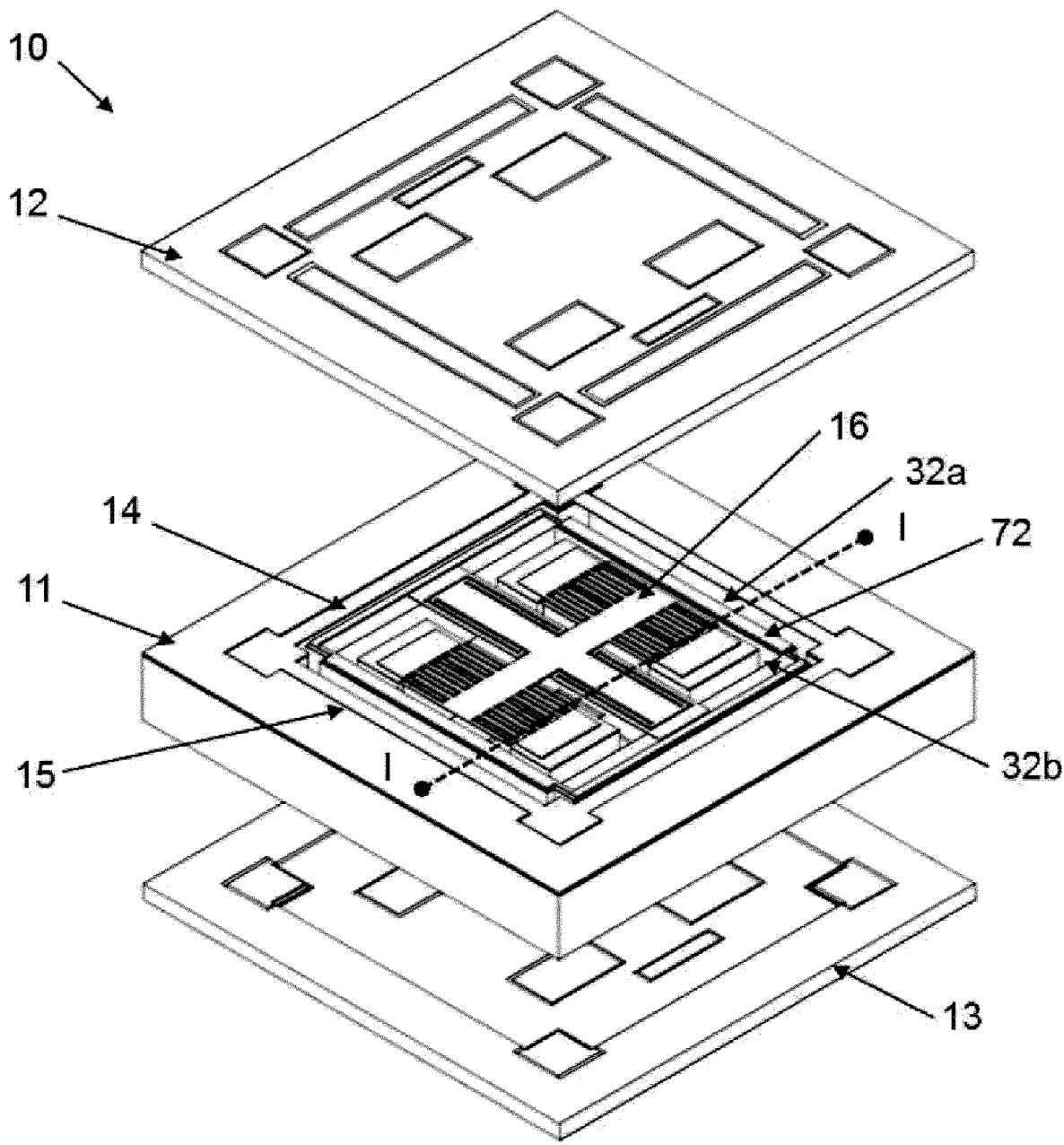
FIG. 19A is a partially exploded perspective view of a 3D MEMS magnetometer, in accordance with another embodiment, wherein the MEMS wafer is partitioned into two cavities. The first cavity encloses the first and second magnetic field transducers, and the second cavity encloses the third magnetic field transducer.
Figure 19B:
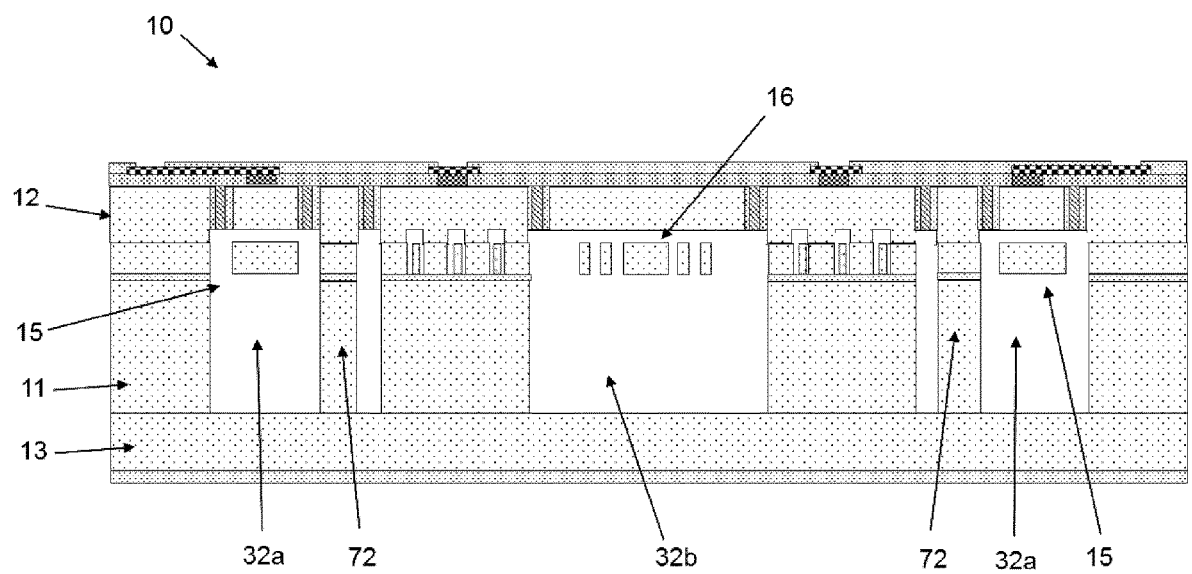
FIG. 19B is a cross-sectional side view of the 3D MEMS magnetometer of FIG. 19A, taken along section line II and showing the wall between the two cavities.

However, in other embodiments, two or three cavities 32 may be provided, each including one or two of the magnetic field transducers 14, 15, 16. By way of example, in the embodiment of FIGS. 19A and 19B, there is shown another embodiment of a MEMS magnetometer 10 in which the MEMS wafer 11 is partitioned into two cavities 32a, 32b separated by a cavity partition wall 72. The first cavity 32a encloses the first and second magnetic field transducers 14, 15, while the second cavity 32b encloses the third magnetic field transducer 16. In such a multi-cavity embodiment, the pressure in each cavity 32a, 32b can be adjusted independently. It will be understood that the number and arrangement of the cavities in a given embodiment of the MEMS magnetometer may be dictated by environmental (e.g., in terms of pressure conditions) and/or mechanical (e.g., in terms of the integrity of the frame structure) considerations.

As used herein, the term "magnetic field transducer" refers to a device, structure or element that provides an output having a value proportional to or otherwise indicative of the value of the magnetic field to be measured. The response of the magnetic field transducers may be physical (e.g., a motion, displacement, deflection, or deformation) or electrical (e.g., a resistance, inductance, or capacitance change), or other. This response may be converted (e.g., by an integrated circuit connected to the MEMS magnetometer) to an electrical signal that can be related to the magnetic field strength. The use of the term "current-carrying" to further characterize the term "magnetic field transducer" refers to the fact that the output of a magnetic field transducer described herein is produced as a result of an interaction between the magnetic field to be measured and an electrical current flowing in the magnetic field transducer.

In the exemplary embodiment of FIGS. 1 and 2A, each of the first, second and third magnetic field transducers 14, 15, 16 is a Lorentz-force-based transducer that relies on a mechanical displacement of a current-carrying conductor caused by the Lorentz force acting thereon as a result of the interaction with the magnetic field. As known in the art, the Lorentz force arises from the interaction between a moving charge or current and an external magnetic field. More particularly, for a fixed conductor of length L the Lorentz force is given by $\vec{F}_L = I\vec{L} \times \vec{B}$, where I is the current in the conductor, $\vec{L}$ is a vector whose direction is aligned with the direction of the current flow in the conductor, $\vec{B}$ is the external magnetic field, and × denotes the vector cross-product. The Lorentz force thus perpendicular to the plane defined by the conductor and the magnetic field.

However, in other embodiments, one or more of the magnetic field transducers 14, 15, 16 may operate based on other magnetic sensing techniques including, but not limited to, techniques based on the Hall effect and techniques based on magnetoresistance (e.g., AMR). More regarding the first, second and third magnetic field transducers 14, 15, 16 will be discussed further below.

Referring still to FIGS. 1 and 2A, the MEMS magnetometer 10 further includes first, second and third electrode assemblies 63, 64, 65 associated respectively with the first, second and third magnetic field transducers 14, 15, 16. Each of the first, second and third electrode assemblies 63, 64, 65 includes one or more sense electrodes and is configured to sense the output of a respective one of the magnetic field transducers 14, 15, 16 induced by a respective one of the magnetic field components $B_x$, $B_y$, $B_z$. It will be understood that the grouping of sense electrodes into first, second and third electrode assemblies 63, 64, 65 is made essentially from a functional standpoint and that, in practice, a given sense electrode of the MEMS magnetometer 10 could, in principle, be part of more than one of the electrode assemblies 63, 64, 65.

In terms of location, the one or more sense electrodes of the first electrode assembly 63 are formed in either or both of the top and bottom cap wafers 12, 13. Likewise, the one or more sense electrodes of the second electrode assembly 64 are also formed in either or both of the top and bottom cap wafers 12, 13. By way of example, in the embodiment of FIGS. 1 and 2A, the first and second electrode assemblies 63, 64 both include a pair of sense electrodes 63a, 63b, 64a, 64b located in the top cap wafer 12. Meanwhile, in the embodiment of FIGS. 18A to 18C, the sense electrodes 63a, 63b, 64a, 64b of the first and second electrode assemblies 63, 64 are etched in the top cap device layer 60 of the top cap wafer 12. Of course, the number and arrangement of the electrodes of the first and second electrode assemblies 63, 64 may differ in other embodiments.

Referring still to FIGS. 1 and 2A, third electrode assembly 65 may be formed in either or both of the top and bottom cap wafers 12, 13, but also or alternatively in the MEMS wafer 11. By way of example, referring also to FIGS. 5, 6A and 6B, the third electrode assembly 65 includes electrodes embodied by sets of conductive digits 37, 38, 39 provided on the third magnetic field transducer 16, which itself is formed in the MEMS wafer 11. In some embodiments, the MEMS magnetometer 10 can include one or more electrical contacts 46 formed on the outer side 122 of the top cap wafer 12, as well as an electrically conductive path 70, embodied by electrical connection 22 in FIG. 2A, extending across and through the top cap wafer 12 to electrically connect the one or more electrical contacts 46 to the conductive digits 37, 38, 39 of third electrode assembly 65. Of course, in other embodiments, the third electrode assembly 65 may have a different number and/or arrangement of electrodes.

As mentioned above, in the exemplary embodiment of FIGS. 1 and 2A, the first, second and third magnetic field transducers 14, 15, 16 include current-carrying, mechanically displaceable structures that are acted upon by the Lorentz force to provide magnetic field sensing capabilities. As a result, in this embodiment, each of the first, second and third electrode assemblies 63, 64, 65 is configured to sense, as variation in capacitance, a displacement of the respective one of the first, second and third magnetic field transducers 14, 15, 16 in response to such a Lorentz force, which is produced by the respective one of the first, second and third magnetic field components $B_x$, $B_y$, $B_z$.

The first, second and third magnetic field transducers 14, 15, 16 can be separated into in-plane magnetic field transducers 14, 15 configured to measure or sense respectively the x and y components of an external magnetic field, and an out-of-plane magnetic field transducer 16 configured to measure or sense the z component of an external magnetic field. More regarding the structure and operation of the magnetic field transducers 14, 15, 16 will now be discussed.

Figure 3:
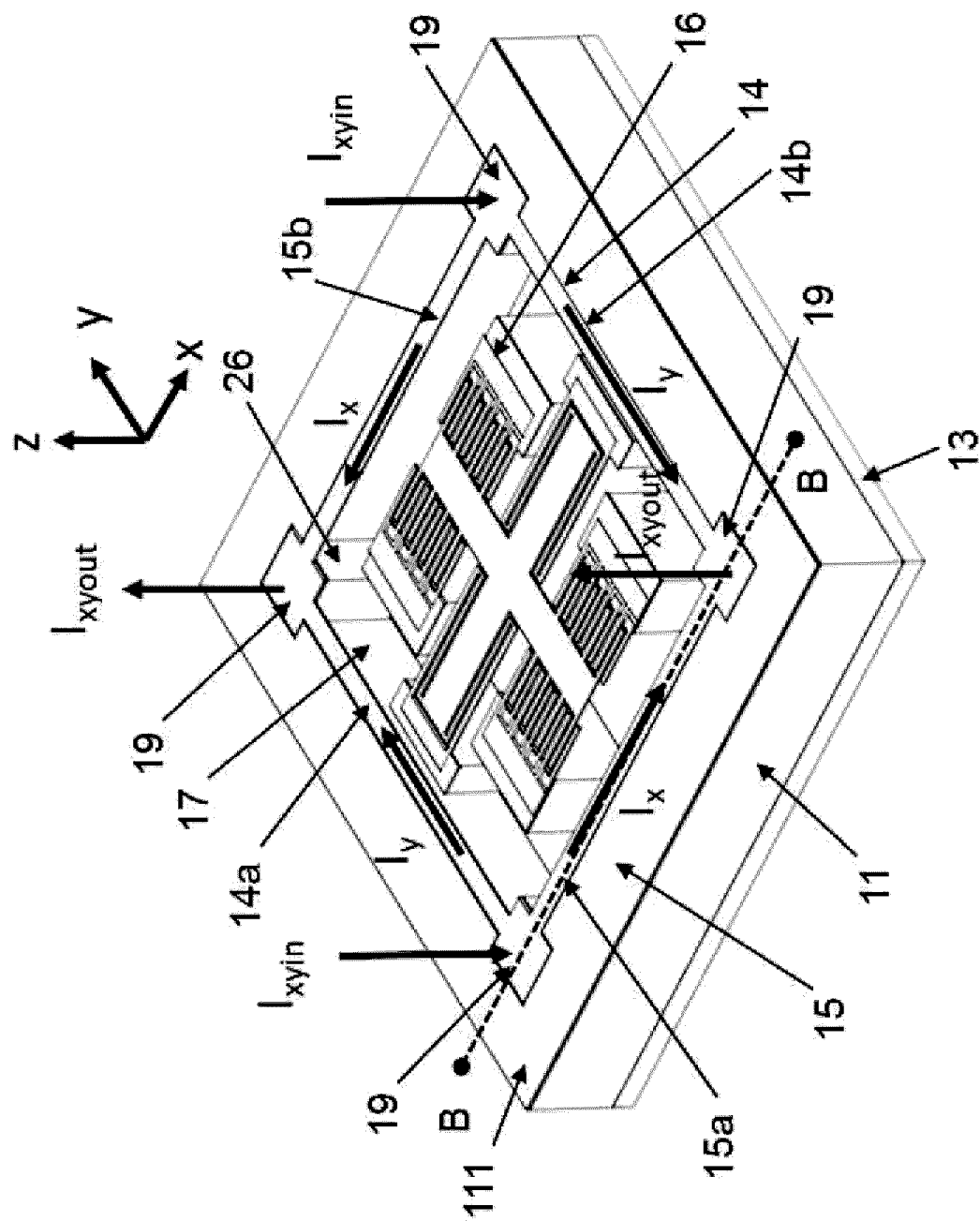
FIG. 3 is another perspective view of the 3D MEMS magnetometer of FIG. 1, in which the top cap wafer has been removed to illustrate current flow in the first and second magnetic field transducers used to sense the magnetic field components along the x and y axes.
Figure 4:
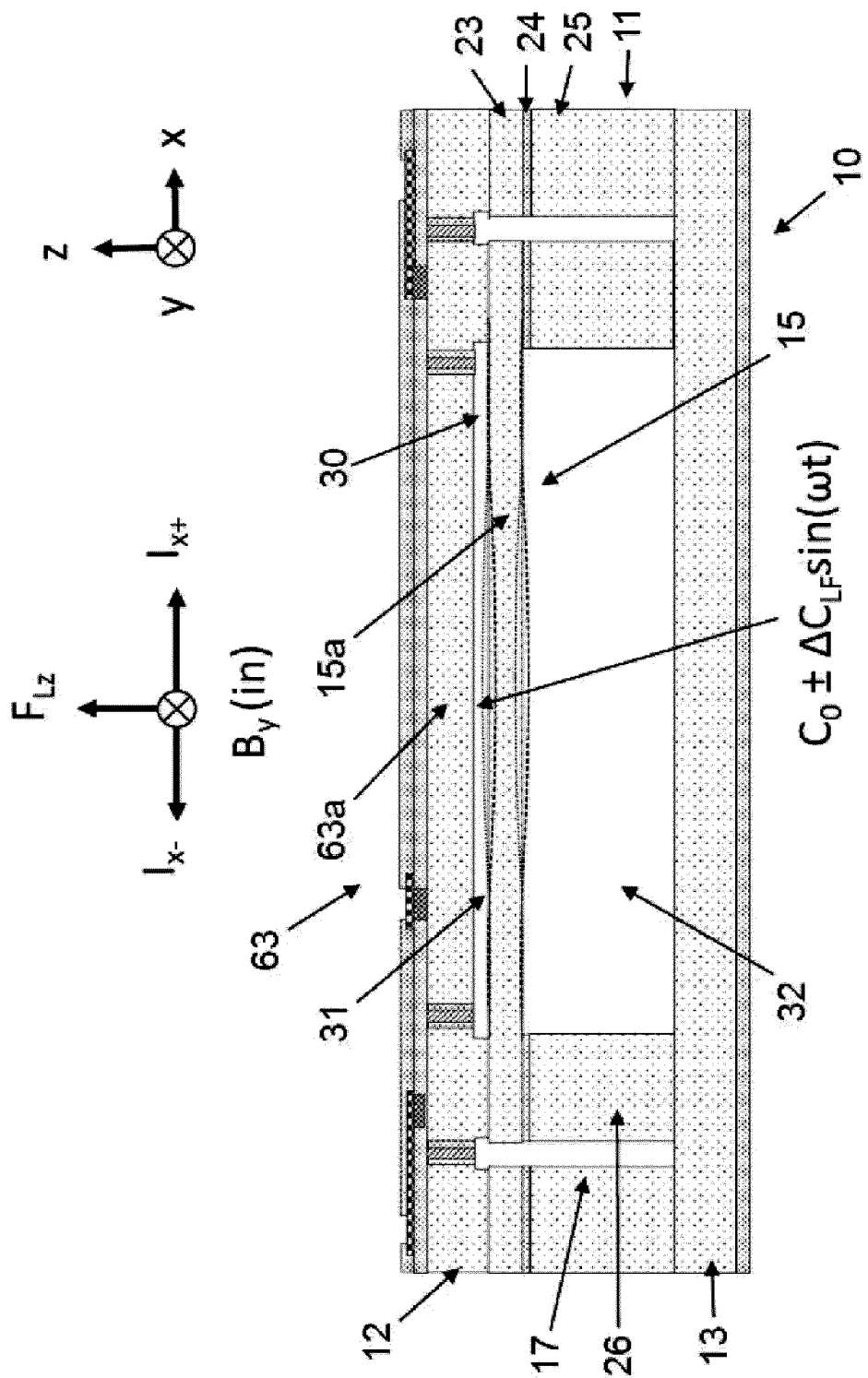
FIG. 4 is a cross-sectional side view of the 3D MEMS magnetometer of FIG. 3, taken along section line BB, illustrating the measurement of the magnetic component along the y axis by the second magnetic field transducer.

Referring to FIGS. 1 and 2A, in conjunction with FIGS. 3 and 4, in some embodiments, the first and second magnetic field transducers 14, 15 can be suspended from the frame structure 17, configured to carry a current $I_y$ and $I_x$ along the y and x axes, respectively, and deflectable along the z axis in response to the Lorentz force produced by the x and y magnetic field components $B_x$, $B_y$, respectively. In such implementations, the first electrode assembly 63 may be capacitively coupled with the first magnetic field transducer 14 and configured to sense, as a variation in capacitance between the first electrode assembly 63 and the first magnetic field transducer 14, the deflection of the first magnetic field transducer 14 along the z axis caused by the Lorentz force produced by the first magnetic field component $B_x$. Likewise, the second electrode assembly 64 may be capacitively coupled with the second magnetic field transducer 15 and configured to sense, as a variation in capacitance between the second electrode assembly 64 and the second magnetic field transducer 15, the deflection of the second magnetic field transducer 15 along the z axis caused by the Lorentz force produced by the second magnetic field component $B_y$.

More specifically, in the exemplary embodiment of FIGS. 1 and 2A, the first magnetic field transducer 14 includes a first pair of elongated transducer elements 14a, 14b extending along the y axis, while the second magnetic field transducer 15 includes a second pair of elongated transducer elements 15a, 15b extending along the x axis, the first and second pairs of elongated transducer elements 14a, 14b, 15a, 15b being arranged in the MEMS device layer 23 so as to form the four sides of a rectangle. In the illustrated embodiment, the elongated transducer elements 14a, 14b, 15a, 15b are resonant membranes shaped as long bridges suspended from the frame structure 17 at their respective ends and mechanically deflectable along the z axis.

Of course, other configurations are possible for the transducers elements 14a, 14b, 15a, 15b including, but not limited, square or rectangular membranes supported on more than two points, as well as circular membranes. In addition, in further embodiments, the in-plane magnetic field transducers 14, 15 need not be embodied by deflectable resonant membranes, but could be based, for example, on comb structures similar to that used for the out-of-plane magnetic field transducer 16 in the embodiment of FIGS. 1 and 2A (see also below). It is to be noted that while the two in-plane magnetic field transducers 14, 15 have substantially identical configurations in FIGS. 1 and 2A, they may have different configurations in other embodiments.

Figure 5:
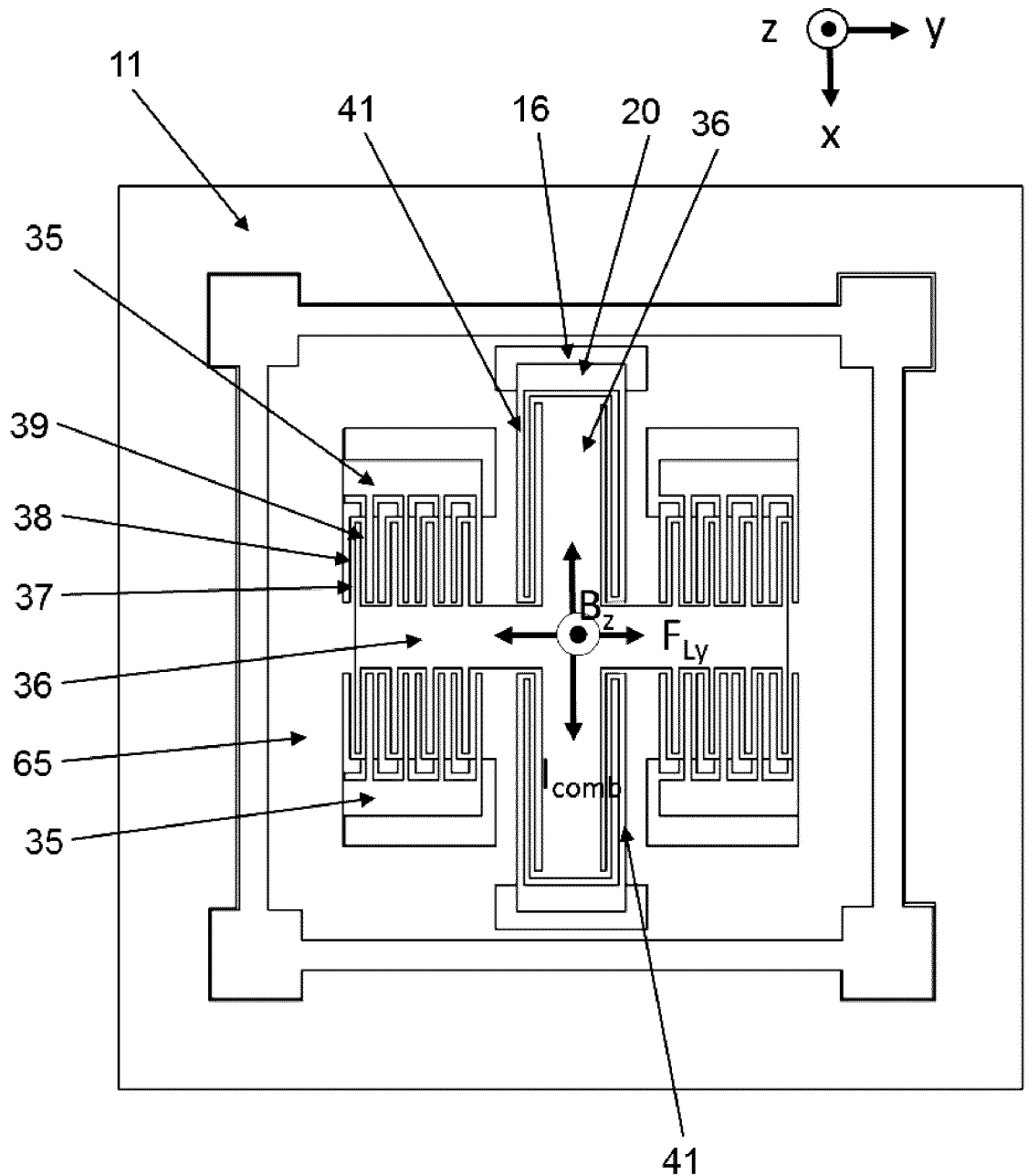
FIG. 5 is a top view of the 3D magnetometer of FIG. 1, in which the top cap wafer has been removed to illustrate the current flow in the third magnetic field transducer used to sense the magnetic field component along the z axis.
Figure 6A:
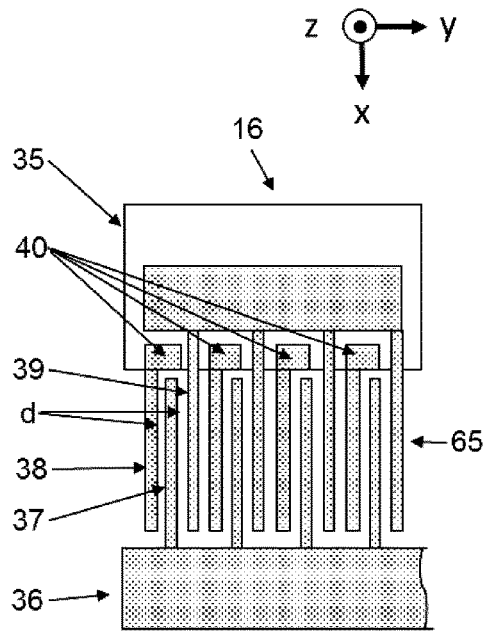
FIG. 6A illustrates the first and second sets of conductive digits of the third magnetic field transducer of FIG. 5, in the absence of an applied magnetic field component along the z axis.
Figure 6B:
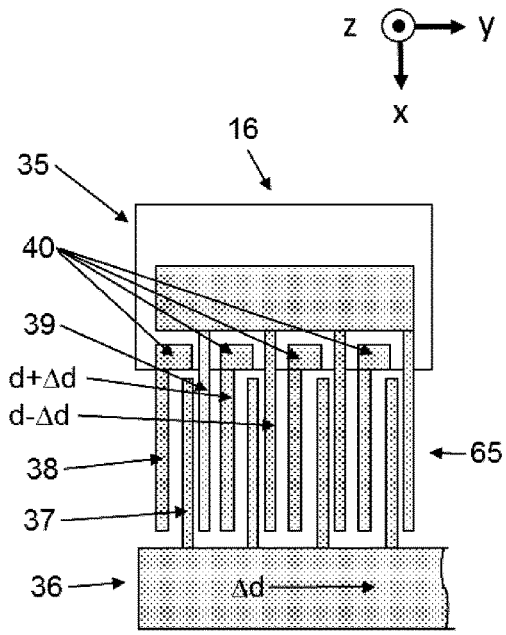
FIG. 6B is the same as FIG. 6A, but in the presence of an applied magnetic field component along the z axis.

Referring to FIGS. 1 and 2A, in conjunction with FIGS. 5, 6A and 6B, in some embodiments, the out-of-plane magnetic field transducer 16 can be embodied by a comb resonator, which can also be referred to as a "comb sensor" or a "comb structure". In the illustrated embodiment, the comb resonator forming the third magnetic field transducer 16 is located inside the rectangle whose sides are defined by the elongated transducer elements 14a, 14b, 15a, 15b forming the first and second magnetic field transducers 14, 15, although this need not be the case in other embodiments.

The comb resonator forming the third magnetic field transducer 16 can include a stationary transducer element 35 and a current-carrying movable transducer element 36. The stationary transducer element 35 is fixed relative to the frame structure 17, while the movable transducer element 36 is displaceable in a plane perpendicular to the z axis (i.e., in the x-y plane) and also configured to carry a current in that plane. In such implementations, the third electrode assembly 65 may be configured to capacitively sense a relative motion between the stationary and the movable transducer elements 35, 36 caused by the Lorentz force acting on the current-carrying movable transducer element 36 in the presence of a magnetic field component $B_z$ along the z axis. Of course, in other embodiments, the out-of-plane magnetic field transducer 16 need not be embodied by a comb resonator, but could be provided, for instance and without limitation, as vertical strips that are resonant in the x-y plane.

Referring to FIGS. 1 and 2A, the first, second and third magnetic field transducers 14, 15, 16 can be mechanically supported by posts 26 fabricated in the MEMS handle layer 25. The magnetic field transducers 14, 15, 16 can also be electrically insulated from the posts 26 by the MEMS insulating layer 24. The posts 26 are part of the frame structure 17 of the MEMS wafer 11. Also, in some embodiments, the portions of the MEMS handle and insulating layers 25, 24 beneath the elongated transducer elements 14a, 14b, 15a, 15b forming the first and second magnetic field transducers 14, 15 and the comb resonator forming the third magnetic field transducer 16 can be removed (e.g., etched) during fabrication to allow these elements to freely. In particular, it will be understood that the dimensions of the elongated transducer elements 14a, 14b, 15a, 15b forming the first and second magnetic field transducers can be selected such that they move more easily along the vertical z axis (i.e., along the vertical thickness of the MEMS magnetometer 10). Likewise, the dimensions of the comb resonator forming the third magnetic field transducer 16 can be selected such that it moves more easily laterally in the x-y plane (i.e., perpendicularly to the thickness of the MEMS magnetometer 10).

Referring still to FIGS. 1 and 2A, each of the first and second electrode assemblies 63, 64 includes one or more sense electrodes 63a, 63b, 64a, 64b (i.e., two each in the illustrated embodiment) formed in the top cap wafer 12. In the illustrated embodiment, each of the four sense electrodes 63a, 63b, 64a, 64b is vertically aligned with the elongated transducer elements 14a, 14b, 15a, 15b. In the illustrated embodiment, the top cap wafer 12 also includes electrical connections 19 through which electrical current can be applied to and collected from the elongated transducer elements 14a, 14b, 15a, 15b forming the first and second magnetic field transducers 14, 15. The top cap wafer 12 may also include electrical connections 20, 21, 22 for providing electrical contact to and from the comb resonator forming the third magnetic field transducer 16.

Furthermore, in the embodiment of FIGS. 1 and 2A, the sense electrode 63a, 63b, 64a, 64b and electrical connections 19, 20, 21, 22 can each be laterally bordered by an insulating closed-loop trench 27 that extends vertically along the z axis to penetrate the entire thickness of the top cap wafer 12. Turning to the embodiment of FIGS. 18A to 18C, in a case where the top cap wafer 12 is an SOI wafer with top cap device, insulating and handle layers 60, 61, 62, then the trenches 27 may extend only partially into the top cap wafer 12, namely only through the thickness of the top cap device layer 60.

Referring now more specifically to FIG. 2A, in some embodiments, the top cap wafer 12 is bonded to the top side 111 of the MEMS wafer 11, thereby forming a hermetic seal 29 along the periphery of the MEMS magnetometer 10 and also establishing electrical contacts 40 between the electrical connections 22 formed in the top cap wafer 12 and the comb resonator forming the third magnetic field transducer 16.

In some embodiments, the top cap wafer 12 may also include recesses 30 formed therein by removing top cap wafer material from an inner side 121 of the top cap wafer 12 prior to bonding the same with the MEMS wafer 11. The recesses 30 define part of the cavity 32 enclosing the magnetic field transducers 14, 15, 16. The recesses 30 also define capacitor gaps 31 between the first electrode assembly 63 and the first magnetic field transducer 14 (e.g., between the sense electrodes 63a, 63b and the elongated transducer elements 14a, 14b), as well as between the second electrode assembly 64 and the second magnetic field transducer 15 (e.g., between the sense electrodes 64a, 64b and the elongated transducer elements 15a, 15b).

In FIG. 2A, the bottom cap wafer 13 is simply bonded to the bottom side 112 of the MEMS wafer 11 to close the MEMS magnetometer 10, thereby forming the hermetically sealed cavity 32 described above. It is to be noted that in embodiments such as shown in FIG. 2A, where the bottom cap wafer is not patterned with electrical contacts and pathways but acts solely as a physical barrier for sealing the cavity 32 enclosing the magnetic field transducers 14, 15, 16, the bottom cap wafer 13 need not be embodied by a standard conducting wafer (e.g., a silicon wafer). Indeed, in such a case, the bottom cap wafer 13 may be embodied by any suitable structure that is capable of forming a hermetic bond with the bottom side 112 of the MEMS wafer 11. By way of example, the bottom cap wafer 13 could then be embodied by a CMOS wafer. In yet other embodiments, the bottom side 112 of the MEMS wafer 11 may be continuous and unpatterned, and may thus act as functionally as a bottom cap wafer such that a distinct bottom cap wafer bonded to the MEMS wafer 11 may be omitted.

Figure 2B:
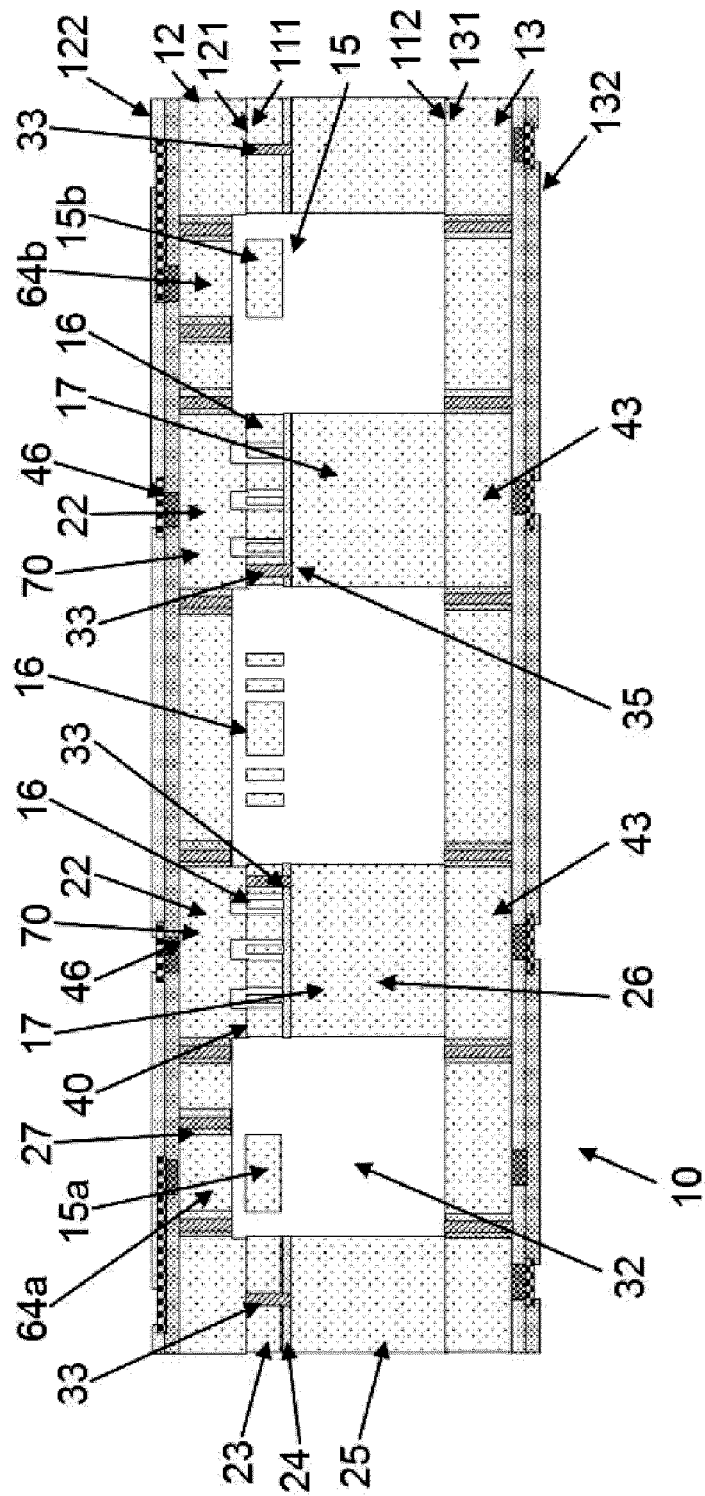
FIG. 2B is a cross-sectional side view of a 3D MEMS magnetometer in accordance with another embodiment, the 3D MEMS magnetometer being provided with bottom cap feedthroughs and silicon-on-insulator (SOI) shunts.

Referring to FIG. 2B, in other embodiments, conducting feedthroughs 43 and electrical contacts 46 can be patterned in the bottom cap wafer 13 to provide electrical connections to the magnetic field transducers 14, 15, 16 from either the top cap wafer 12 or the bottom cap wafer 13. Also, in FIG. 2B, the SOI conducting shunts 33 formed through the MEMS insulating layer 24 can be used to establish electrical connections between the magnetic field transducers 14, 15, 16 formed in the MEMS device layer 23 and the associated posts 26 formed in the MEMS handle layer 25. In yet other embodiments, the cavity 32 enclosing the magnetic field transducers 14, 15, 16 can also be defined partly by recesses formed by removing bottom cap wafer material from an inner side 131 of the bottom cap wafer 13 prior to bonding with the prior to bonding the same with the MEMS wafer 11.

The operation of the first, second and third magnetic field transducers will now be described in greater detail with reference to FIGS. 3, 4, 5, 6A and 6B.

Referring to FIGS. 3 and 4, the operation of the in-plane magnetic field transducers 14, 15 will be considered first. FIG. 3 is perspective view of the MEMS magnetometer 10 of FIG. 1, in which the top cap wafer 12 has been removed to illustrate current flow in the first and second magnetic field transducers 14, 15 used to sense the magnetic field components along the x and y axes. FIG. 4 is a cross-sectional side view of the MEMS magnetometer of FIG. 3 illustrating the measurement of the magnetic component along the y axis by the second magnetic field transducer 15. As mentioned above, in the illustrated embodiment, the first magnetic field transducer 14 includes a first pair of elongated transducer elements 14a, 14b extending along the y axis, while the second magnetic field transducer 15 includes a second pair of elongated transducer elements 15a, 15b extending along the x axis.

In the illustrated embodiment, a drive current $I_{xyin}$ is injected into the elongated transducer elements 14a, 14b, 15a, 15b from two diagonally opposed corner electrical connections 19 formed through the top cap wafer 12 and into the MEMS device layer 23 of the MEMS wafer 11. A drive current $I_{xyout}$ is removed through two other similar diagonally opposed corner electrical connections 19. In the illustrated embodiment, all of the elongated transducer elements 14a, 14b, 15a, 15b are configured to carry equal currents, with the transducer elements 14a, 14b of the first pair carrying opposite currents, and the transducer elements 15a, 15b of the second pair also carrying opposite currents. More specifically, in the illustrated embodiment, the drive current $I_{xyin}$ splits evenly into current $I_x$ and current $I_y$, where current $I_y$ flows in opposite directions in the transducer elements 14a, 14b, and the current $I_x$ also flows in opposite direction in the transducers elements 15a, 15b. Of course, it will be understood that although it may be advantageous in some implementations that the currents $I_x$ and $I_y$ have the same amplitude to simplify the current splitting, this need not be the case in other embodiments. By way of example, in some embodiments, four current sources could be used to independently control the current flowing in each of the elongated transducer elements 14a, 14b, 15a, 15b.

Referring still to FIGS. 3 and 4, in some embodiments, the first and second magnetic field transducers 14, 15 form first and second resonant structures having associated resonant frequencies. In such a case, each of the first, second and third magnetic field transducers configured to carry an alternating current $I_x \sin(\omega t)$ or $I_y \sin(\omega t)$ oscillating at a frequency $\omega$ matching its resonant frequency. In FIGS. 3 and 4, this resonant frequency corresponds to the resonant frequency of the corresponding one of the transducer elements 14a, 14b, 15a, 15b.

In general, the external magnetic field to be sensed can point in any direction, and the Lorentz force $\vec{F}_L = I\vec{L} \times \vec{B}$ will always be perpendicular to the plane defined by the external magnetic field and the direction of current flow in the elongated transducer elements 14a, 14b, 15a, 15b. However, because the elongated transducer elements 14a, 14b, 15a, 15b are configured such that they can only move along the z axis, they are sensitive only to the z component $F_{Lz}$ of the Lorentz force. In other words, the deflection of each elongated transducer elements 14a, 14b, 15a, 15b is determined by $F_{Lz}$.

Furthermore, because the Lorentz force is perpendicular to the plane formed by the direction of current flow and the magnetic field vector, the Lorentz force $F_{Lz}$ acting on the transducer elements 14a, 14b, in which current flows along the x axis, will be produced by the magnetic field component $B_y$. Meanwhile, the Lorentz force $F_{Lz}$ acting on the transducer elements 15a, 15b, in which current flows along the y axis, will be produced by the magnetic field component $B_x$. Hence, in FIG. 4, for a given magnetic field $B_y$, the Lorentz force $F_{Lz}$ due to the alternating current $I_x \sin(\omega t)$ along the x direction causes the elongated transducer elements 15a to oscillate at its resonant frequency in the z direction, thus increasing the sensitivity of the response.

Referring now to FIGS. 1, 3 and 4, the first electrode assembly 63 includes a pair of sense electrodes 63a, 63b which form a first pair of capacitors with the first pair of elongated transducer elements 14a, 14b and is configured to measure a first differential capacitance between the first pair of capacitors. This first differential capacitance is indicative of a magnitude of the first magnetic field component. Similarly, the first electrode assembly 64 includes a pair of sense electrodes 64a, 64b which form a second pair of capacitors with the second pair of elongated transducer elements 15a, 15b and is configured to measure a second differential capacitance between the second pair of capacitors. This second differential capacitance is indicative of a magnitude of the second magnetic field component. In other words, the transducer elements 14a, 14b, 15a, 15b response to changes in magnetic field components $B_y$ and $B_x$ by deflecting toward or away from the corresponding electrodes 63a, 63b, 64a, 64b, thereby changing the capacitance between the transducer elements and their corresponding electrodes.

It will be understood that, in some embodiments, capacitors can be formed between the sense electrodes 63a, 63b, 64a, 64b provided in the top cap wafer 12 and the elongated transducer elements 14a, 14b, 15a, 15b due to the provision of recesses 30 formed in the inner side 121 of the top cap wafers. In such embodiments, the motion of the elongated transducer elements 14a, 14b, 15a, 15b can be monitored by using the sense electrodes 63a, 63b, 64a, 64b to measure a capacitance $C_0 \pm \Delta C_{LF} \sin(\omega t)$, where $C_0$ is the rest capacitance between each of the elongated transducer elements 14a, 14b, 15a, 15b and the respective one of the sense electrode 63a, 63b, 64a, 64b, and where $C_{LF}$ is the amplitude of the response to the oscillating Lorentz force. This is illustrated in FIG. 4 for the motion of the transducing element 15a.

Furthermore, since the transducing elements 14a, 14b carries equal and opposite currents, and likewise for the transducing elements 15a, 15b, the transducing elements 14a, 14b oscillate 180 degrees out of phase, and so do the transducing elements 15a, 15b. Therefore, the differential capacitance corresponding to the difference between the capacitance between the electrode 63a and the transducer element 14a, and the capacitance between the electrode 63b and the transducer element 14b, is equal to $2\Delta C_{LF} \sin(\omega t)$, and so is the differential capacitance corresponding to the difference between the capacitance between the electrode 64a and the transducer element 15a, and the capacitance between the electrode 64b and the transducer element 15b. In such embodiments, the sensitivity of magnetic field measurement can be increased by eliminating the static capacitance $C_0$ and by measuring at the membrane mechanical resonant frequency. Of course, other embodiments need not rely on difference capacitance measurements.

Turning to FIGS. 5, 6A and 6B, the operation of the out-of-plane magnetic field transducer 16 will now be considered. It is worth mentioning that in a typical planar MEMS device, drive currents are essentially constrained to the plane of the device. Therefore, it follows that in order to measuring the out-of-plane magnetic field component $B_z$ using the Lorentz force, a magnetic field transducer that responds to the Lorentz force in the plane of the device should be used. For this purpose, and as mentioned above, the out-of-plane magnetic field transducer 16 may be embodied by a comb resonator that includes a stationary transducer element 35, which is fixed relative to the frame structure 17, and a current-carrying movable transducer element 36. The movable transducer element 36, or shuttle, is displaceable in the x-y plane and also configured to carry a current in the x-y plane along a direction perpendicular to the direction of motion. The third electrode assembly 65 is configured to capacitively sense a relative motion between the stationary transducer element 35 and the movable transducer element 36, this relative motion being indicative of a magnitude of the magnetic field component $B_x$. It is noted that using a comb resonator structure for the out-of-plane magnetic field transducer 16 may advantageously provide a larger sensing capacitance area in the plane of the device than simpler beam structures.

Referring still to FIGS. 5, 6A and 6B, the third electrode assembly 65 forms an interdigitated capacitive structure comprising at least one first set of conductive digits 38, 39 (e.g., two sets in the illustrated embodiment) provided on the stationary transducer element 35 and at least one second set of conductive digits 37 (e.g., one set in the illustrated embodiment) provided on the movable transducer element 36, where the at least one first set and the at least one second set of conductive digits 37, 38, 39 are interlocked and capacitively coupled with each other. It is noted that interdigitated capacitive structures are known in the art, and need not be described in detail herein.

In the illustrated embodiment, the movable transducer element 36 is suspended from the frame structure 17 via folded springs 41 that enable the movable transducer element 36 to move laterally, that is, in a plane perpendicular to the z axis. An oscillating current $I_{comb} \sin(\omega t)$ is injected at the electrical connections 20 provided where the folded springs 41 are provided, and runs through the springs 41 and down a central beam 66 of the movable transducer element 36. This central beam 66 extends along the x direction in FIG. 5. In the illustrated embodiment, the movable transducer element 36 also includes a transverse beam 67 extending along the y direction and from which extend the set of conductive digits 37.

The x-directed oscillating current $I_{comb} \sin(\omega t)$ flowing in the movable transducer element 36 interacts with the magnetic field component $B_z$ to produce an oscillating Lorentz force $F_{Ly}$ in the y direction, that is, perpendicular to the central beam 66 of the movable transducer element 36. The resulting oscillations of the movable transducer element 36 along the y axis can be detected by the third electrode assembly 65 by measuring the capacitance between the set of conductive digits 37 provided on the movable transducer element 36 and the two sets of conductive digits provided on the stationary transducer element 35.

FIGS. 6A and 6B provide more detail on the structure and operation of the out-of-plane magnetic field transducer 16 shown in the embodiment of FIG. 5. Referring to FIG. 6A, in the absence of an external magnetic field, the set of conductive digits 37 on the movable element 36 are positioned an equal distance d from each of the two sets of conductive digits 38, 39 on the stationary transducer member 35. Therefore, the capacitance between each pair of adjacent movable digit 37 and first stationary digit 38 and the capacitance between each pair of adjacent movable digit 37 and second stationary digit 39 are the same and equal to $C_0$.

Turning to FIG. 6B, when the movable transducer element 36 translates laterally by a distance Δd in response to a Lorentz force $F_{Ly}$, the capacitance between each of pair of adjacent movable digit 37 and first stationary digit 38 decreases to a linear approximation by $C_0 \Delta d/d$, while the capacitance between each of pair of adjacent movable digit 37 and second stationary digit 39 increases by the same amount. Thus, the differential capacitance change due to the magnetic field between the two capacitors is approximately $2C_0 \Delta d/d$.

Referring back to FIGS. 1, 2A and 2B, in some embodiments, the conductive digits 38, 39 on the stationary transducer element 35 are connected through electrical contacts 40 to electrical connections 21, 22 in the top cap wafer 12 so all the comb capacitances can be measured in parallel. Thus, in some embodiments, the measured capacitance, from which $B_z$ can be determined, can be magnified by the number of conductive digits provided as well as by the resonance gain due to using a drive current whose oscillating frequency matches or nearly matches the mechanical resonance frequency of the movable transducer element 36.

Method of Measuring a Magnetic Field

In accordance with another aspect, there is provided a method for measuring first, second and third magnetic field components along mutually orthogonal first, second and third axes, respectively.

The method first includes a step of providing a 3D MEMS magnetometer such as described herein, or another MEMS magnetometer. The method also includes a step of flowing current into each of the first, second and third magnetic field transducers of the MEMS magnetometer. The method further includes a step of sensing an output of each the first, second and third magnetic field transducers induced by and indicative of a respective one of the first, second and third magnetic field components.

In some embodiments, the flowing step may include flowing a first current into the first magnetic field transducer and flowing a second current into the second magnetic field transducer. In such embodiments, the first magnetic field transducer may be deflectable along the third axis and configured to carry a first current along the second axis, while the second magnetic field transducer may also be deflectable along the third axis but configured to carry a second current along the first axis. The flowing step may also include flowing a third current into a movable transducer element of the third magnetic field transducer. In such embodiments, the movable transducer element may be displaceable relative to a stationary transducer element of the third magnetic field transducer and configured to carry the third current in a plane perpendicular to the third axis.

In some embodiments, the sensing step may include the following sub-steps.

A first sub-step of sensing, as a first capacitance, a deflection of the first magnetic field transducer along the third axis in response to a first Lorentz force resulting from an interaction between the first current and the first magnetic field component. The first capacitance thus sensed is indicative of a magnitude of the first magnetic field component.

A second sub-step of sensing, as a second capacitance, a deflection of the second magnetic field transducer along the third axis in response a second Lorentz force resulting from an interaction between the second current and the second magnetic field component. The second capacitance thus sensed is indicative of a magnitude of the second magnetic field component A third sub-step of sensing, as a third capacitance, a relative motion between the stationary and movable transducing elements in said plane. The third capacitance thus sensed is indicative of a magnitude of the third magnetic field component.

Method of Manufacturing a MEMS Magnetometer

In accordance with another aspect, there is provided a method of manufacturing a MEMS magnetometer. The method of manufacturing will be described with reference to the diagrams of FIGS. 7A to 17B, which schematically illustrate steps of an exemplary, non-limiting embodiment. It will be understood that the manufacturing method can, by way of example, be performed to fabricate MEMS magnetometers like that described herein, or any other suitable MEMS magnetometer.

Figure 7A:
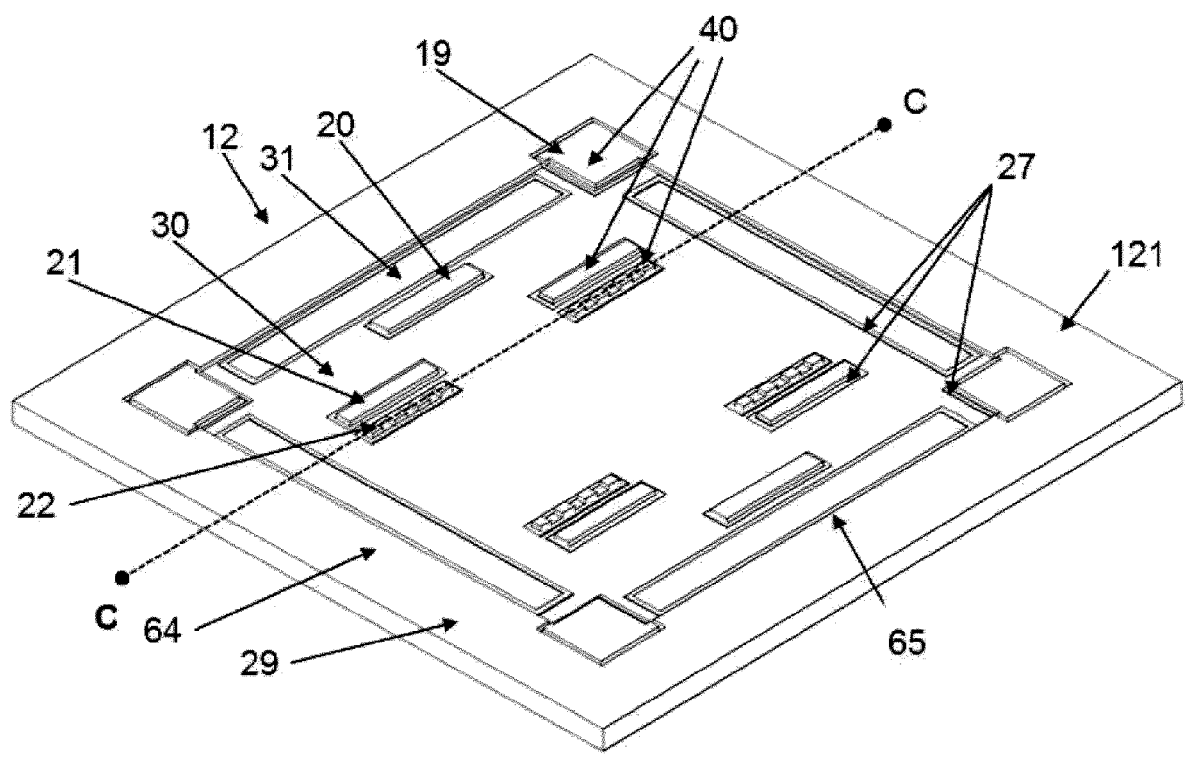
FIG. 7A is a perspective view of the inside of the top cap wafer of a 3D MEMS magnetometer during a manufacturing process thereof, in accordance with an embodiment.
Figure 7B:
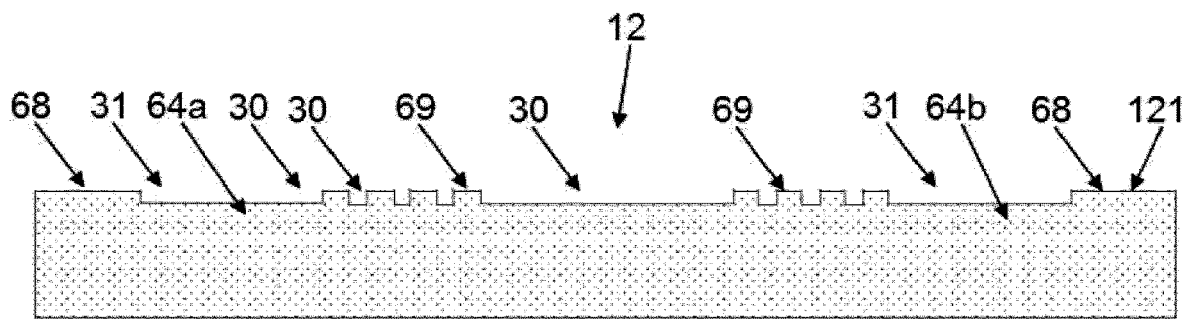
FIG. 7B is a cross-sectional side view of the inside of the top cap wafer of FIG. 7A, taken along section line CC, illustrating the fabrication of recesses in the top cap wafer.

Referring to FIGS. 7A and 7B, the construction of a MEMS magnetometer according to a possible embodiment of present invention may first include a step of patterning a top cap wafer 12 (e.g., made of silicon) with a certain top cap electrode pattern by first patterning recesses 30 partially into what will become an inner side 121 of the top cap wafer 12. The gap pattern defined by the recesses 30 outlines the capacitor gaps 31 between the elongated transducers elements (e.g., resonant membranes) and the top cap electrode to be formed later in the process, but leaves boundaries 68 and islands 69 where the bonds for sealing and electrical contact will be formed between the top cap wafer 12 and the MEMS wafer. This can be done by etching or other methods such as patterned oxidation and wet etch.

Figure 7C:
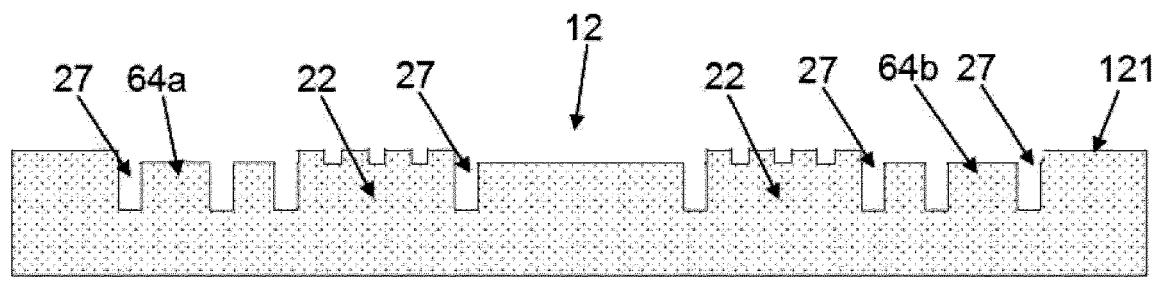
FIG. 7C is a cross-sectional side view of the top cap wafer of FIG. 7A, taken along section line CC, showing the fabrication of the isolation trenches in the top cap wafer.
Figure 7D:
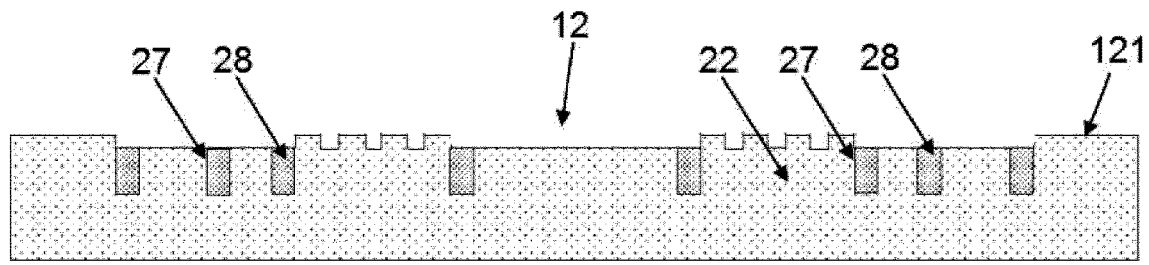
FIG. 7D is a cross-sectional side view of an implementation of the top cap wafer of FIG. 7A, taken along line CC, where the trenches are filled with an insulator.
Figure 7E:
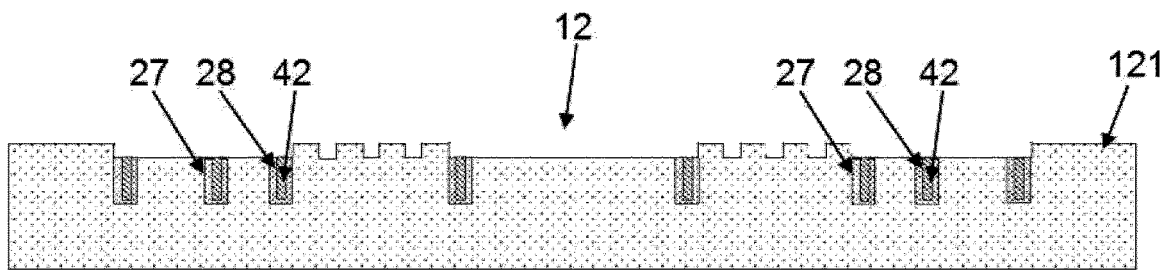
FIG. 7E is a cross-sectional side view of a top cap wafer of another embodiment of the 3D MEMS magnetometer, where the trenches are lined with an insulator and then filled with a conductor.

Referring to FIG. 7C, trenches 27 are next patterned in the stop cap wafer 12 to outline sense electrodes 64a, 64b and electrical connections 19, 20, 21, 22 (see also FIG. 1 illustrating electrical connections 19, 20, 21). The trenches 27 are then filled with either an insulating material 28 (FIG. 7D) or an insulating layer followed by a conductive fill 42 (FIG. 7E). Various trench and fill processes are available at different MEMS fabrication facilities and the insulating and conducting materials may vary between them. The trenches 27 can be either completely filled with an insulating material, or lined with an insulating material with the remainder of the trench filled with a conductor such as polycrystalline silicon. The details of the trench and fill process will depend upon the overall process and thermal budget. For example, for a process using fusion bonding, the temperature of the wafers can rise to around 1000 degrees, so that any insulator and conductor used should generally be materials that can tolerate high-temperature excursions, such as thermal or LPCVD (Low Pressure Chemical Vapor Deposition) oxide for the insulator and polycrystalline silicon for the conducting fill. For lower temperature bonding processes, other materials such as PECVD (Plasma Enhanced CVD) oxide and plated metals can be used. However, it is generally desirable that islands of silicon in the shape of the sense electrodes of the first and second electrode assemblies and electrical connections surrounded by insulating barriers 27 are patterned into the top cap wafer 12 to a sufficient depth greater than the final desired cap thickness.

Figure 7F:
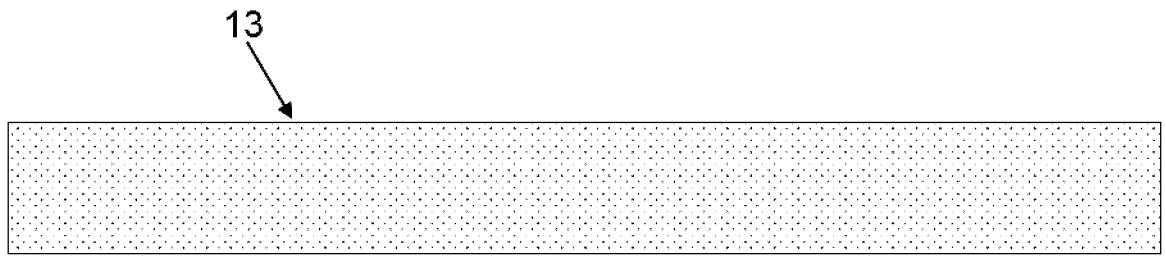
FIG. 7F is a cross-sectional side view of a bottom cap wafer of another embodiment of the 3D MEMS magnetometer, with no electrical feedthroughs.
Figure 7G:
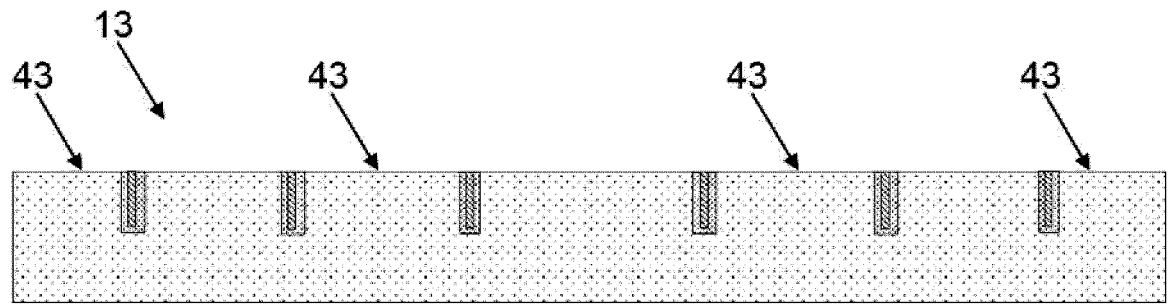
FIG. 7G is a cross-sectional side view of a bottom cap wafer of another embodiment of the 3D MEMS magnetometer, with electrical feedthroughs.

In one exemplary embodiment, the bottom cap wafer 13 is unpatterned (FIG. 7F). However, in another embodiment a similar trench and fill process may be performed on the bottom cap wafer 13 to form a similar bottom cap electrical connection pattern 43 (FIG. 7G). The bottom cap electrode pattern may be used in this case only to form electrical connections 43 that enable input/output (I/O) signals to be fed through the MEMS magnetometer to and from the top cap electrical connections for access by the sensor system. In some implementations, the bottom cap electrode pattern does not require an actual electrode, since the bottom cap is merely a seal for the cavity (see, e.g., FIG. 12).

Figure 8:
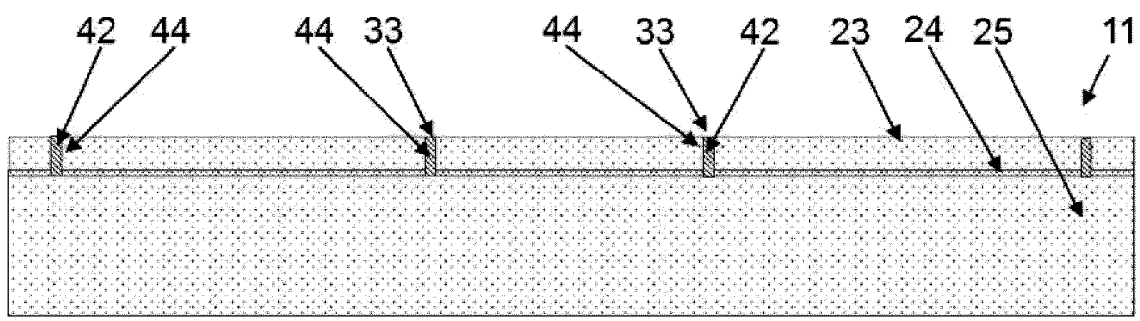
FIG. 8 is a cross-sectional side view of a MEMS wafer of an embodiment of a 3D MEMS magnetometer, illustrating the fabrication of silicon-on-insulator (SOI) shunts.

Referring to FIG. 8, if electrical connections extending through the MEMS wafer 11 and bottom cap wafer 13 are desired, SOI conducting shunts 33 may be formed that extend between the MEMS device layer 23 and the MEMS handle layer 25 through the MEMS insulating layer 24 (e.g., buried oxide). Contact vias 44 may be patterned in desired spots and etched through the MEMS device layer 23 and the MEMS insulating layer 24 to or slightly into the MEMS handle layer 25. These contact vias 44 may then be filled with a conducting material 42 which can be doped polycrystalline silicon (polysilicon), metal, or another conducting material. In this way, an electrical path is formed vertically between the MEMS device layer 23 and the MEMS handle layer 25 at desired spots. If no bottom cap electrical connections are required or desired, SOI shunts can be omitted.

Figure 9A:
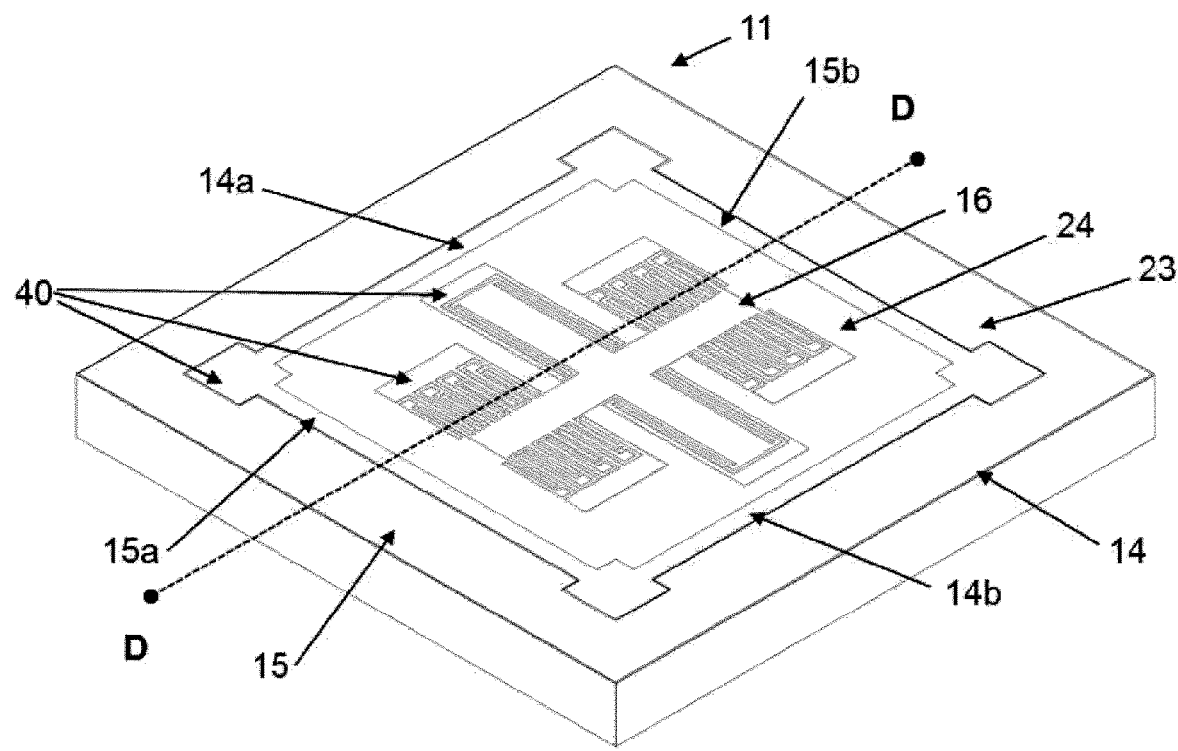
FIG. 9A is a perspective view of an SOI MEMS wafer of an embodiment of a 3D MEMS magnetometer, illustrating the fabrication of the first, second and third magnetic field transducers in the MEMS device layer.
Figure 9B:
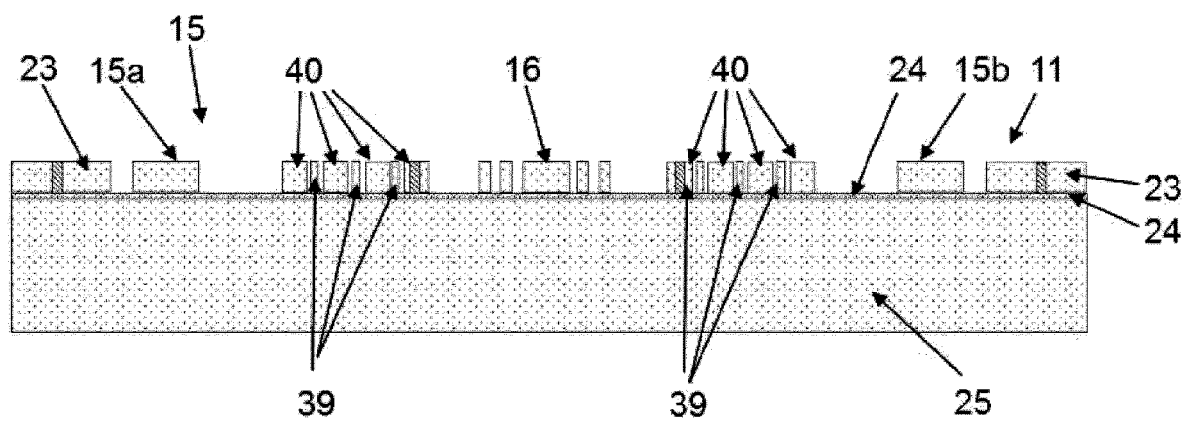
FIG. 9B is a cross-sectional side view of the MEMS wafer of FIG. 9A, taken along section line DD.

Referring now to FIGS. 9A and 9B, the SOI device layer 23 of the MEMS wafer 11 can be patterned with elongated transducer elements 14a, 14b, 15a, 15b (e.g., resonant membranes) forming first and second magnetic field transducers 14, 15 such as described above (see, e.g., FIGS. 1 to 3), electrical connections 40, and a comb sensor forming a third magnetic field transducer 16. The patterning can be done, for example by photolithography and etching of the MEMS device layer 23 stopping at the MEMS insulating layer 24.

Figure 10:
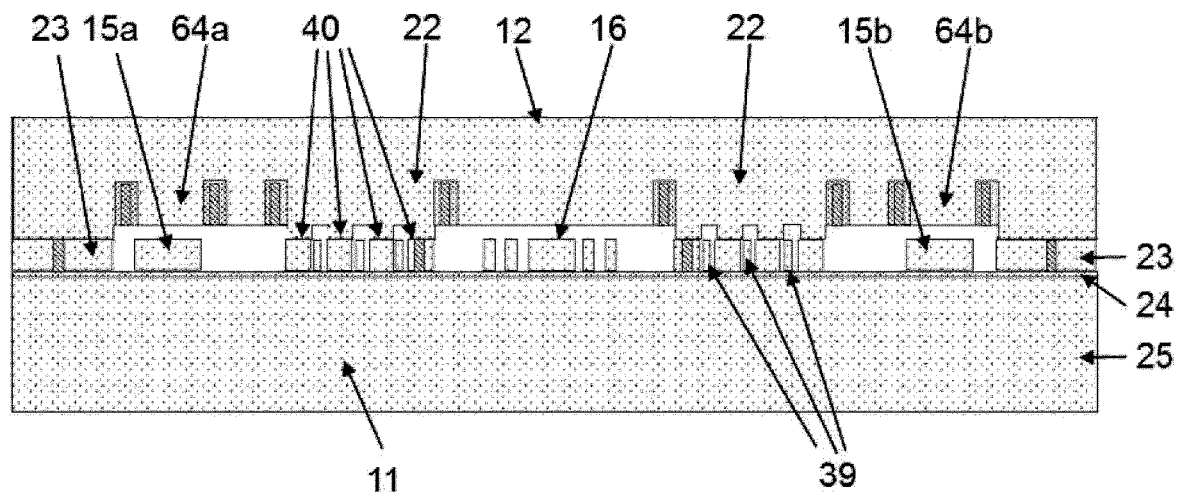
FIG. 10 shows the bonding of a top cap wafer to a MEMS wafer of the 3D MEMS magnetometer, in accordance with an embodiment.

Referring to FIG. 10, the top cap wafer 12 may then be aligned and bonded to the SOI device layer 23 of the MEMS wafer 11. The elongated transducer elements 15a, 15b (e.g., resonant membranes) are thereby aligned with their corresponding sense electrodes 64a, 64b, and electrical connections 40 on the magnetic field transducers 14, 15, 16 are bonded to electrical connections 19, 20, 21, 22 on the top cap wafer 12 (see also FIG. 1). The wafer bonding process used provides a conductive bond such as fusion bonding, gold thermocompression bonding, or gold-silicon eutectic bonding in order to ensure good electrical contacts.

Figure 11A:
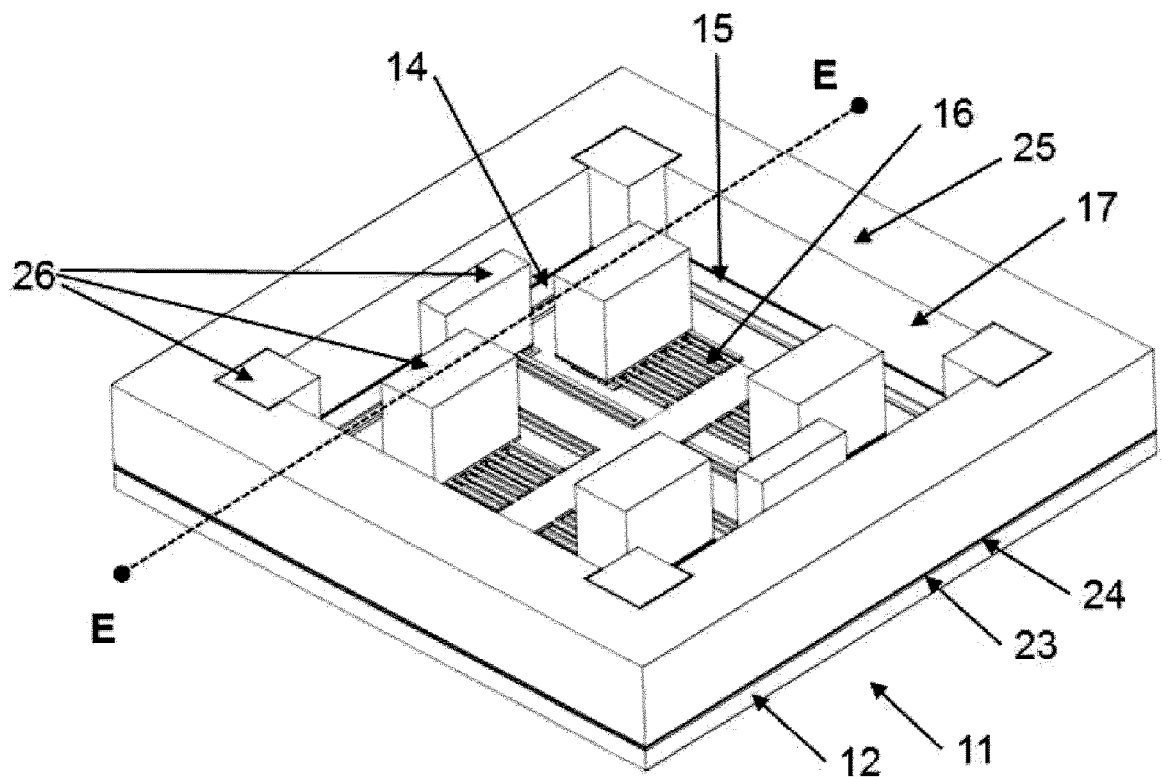
FIG. 11A is a perspective, upside down view of a MEMS wafer bonded to a top cap wafer, illustrating the patterning of posts in the MEMS handle layer and the release of the first, second and third magnetic field transducers.
Figure 11B:
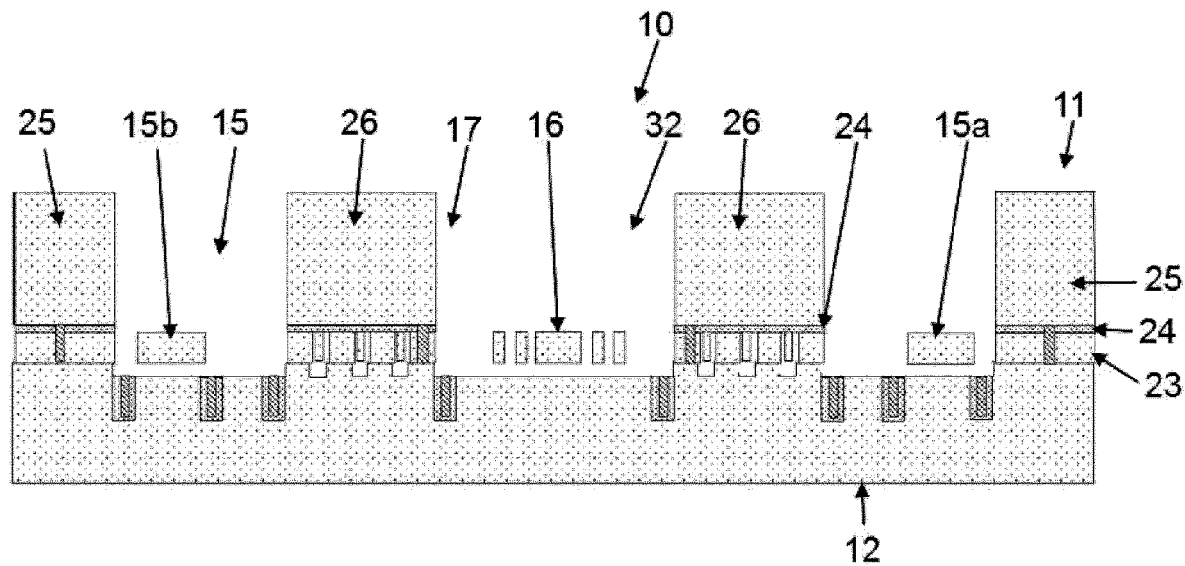
FIG. 11B is a cross-sectional side view of FIG. 11A, taken along section line EE.

Referring now to FIGS. 11A and 11B, the bonded wafer is flipped upside down and the SOI handle layer 25 of the MEMS wafer 11 is patterned with posts 26 that define a part of a frame structure 17 of the MEMS wafer 11. The patterning of the posts 26 can be done using, for example, a deep reactive ion etch (DRIE) of the silicon. The exposed insulating layer 24 of the MEMS wafer 11 is also etched away in the process, thereby mechanically releasing the MEMS magnetic field transducers 14, 15, 16.

Figure 12:
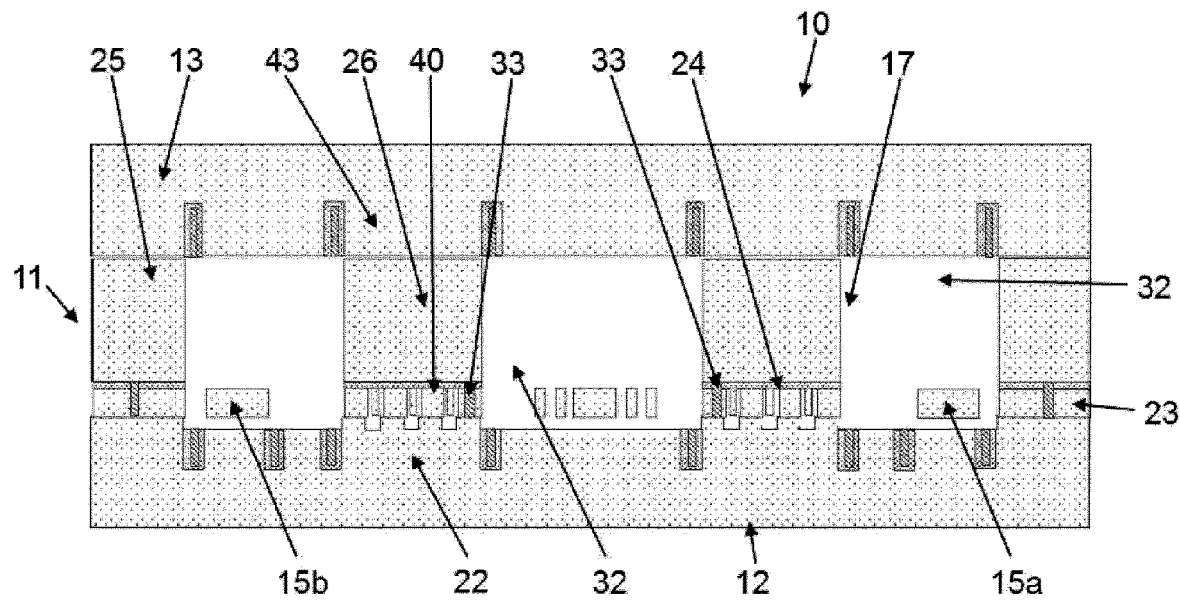
FIG. 12 is a cross-sectional side view of an embodiment of the 3D MEMS magnetometer during a manufacturing process thereof, illustrating the bonding of the bottom cap wafer to the MEMS wafer.

Referring to FIG. 12, the bottom cap wafer 13 is next bonded to the bottom side 112 of the MEMS wafer 11 (i.e., to the bottom side of the MEMS handle layer 25), again using a conductive wafer bonding method or another suitable method. If SOI conducting shunts 33 were provided in the MEMS insulating layer 24 and electrical connections 43 provided in the bottom cap wafer 13, then a conductive path is provided from the bottom feedthroughs 43 and successively upwardly through the posts 26 in the MEMS handle layer 25, SOI conducting shunts 33, MEMS device layer electrical contacts 40 and the top cap electrical connections 22.

Figure 13A:
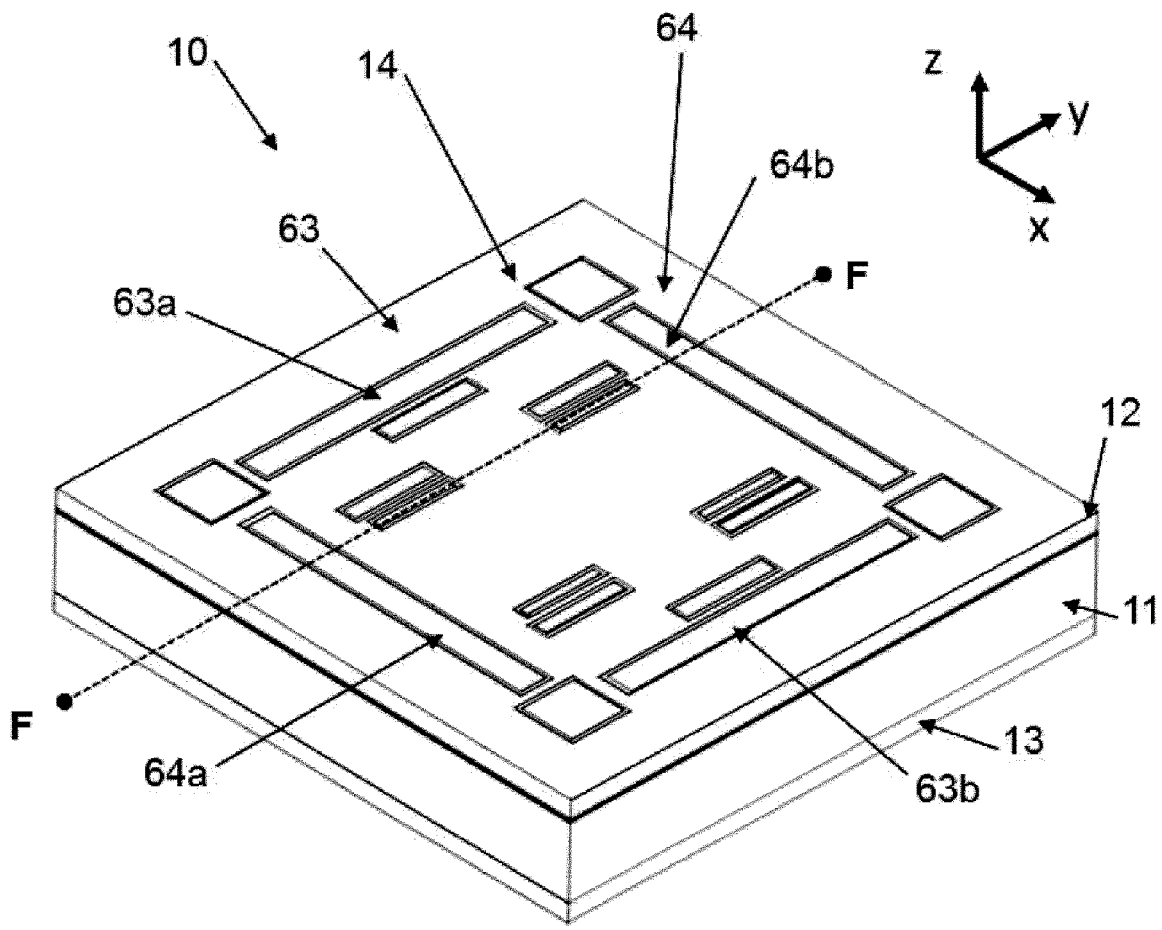
FIG. 13A is a perspective view of an embodiment of the 3D MEMS magnetometer during a manufacturing process thereof, showing the grinding, polishing, and passivation of the top and bottom cap wafers.
Figure 13B:
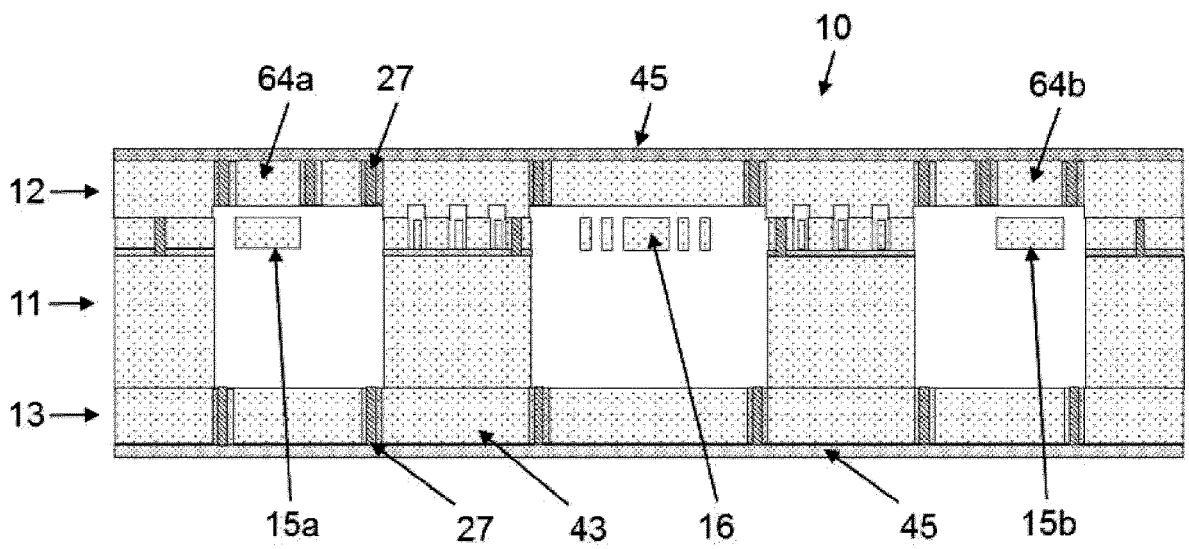
FIG. 13B is a cross-sectional side view of FIG. 13A, taken along section line FF.

Referring to FIGS. 13A and 13B, at this point the MEMS wafer 11 is hermetically sealed between the top cap wafer 12 and the bottom cap wafer 13, and aligned with the top cap electrodes 64a, 64b. The top cap wafer 12 may then be ground and polished to expose the insulating channels or trenches 27. If electrical connections or feedthroughs 43 are provided in the bottom cap wafer 13, the bottom cap wafer 13 can be similarly ground and polished. Both surfaces may then be passivated by depositing, typically using plasma enhanced chemical vapor deposition (PECVD), an insulating layer 45 (e.g., an oxide layer) to insulate and protect them.

Figure 14:
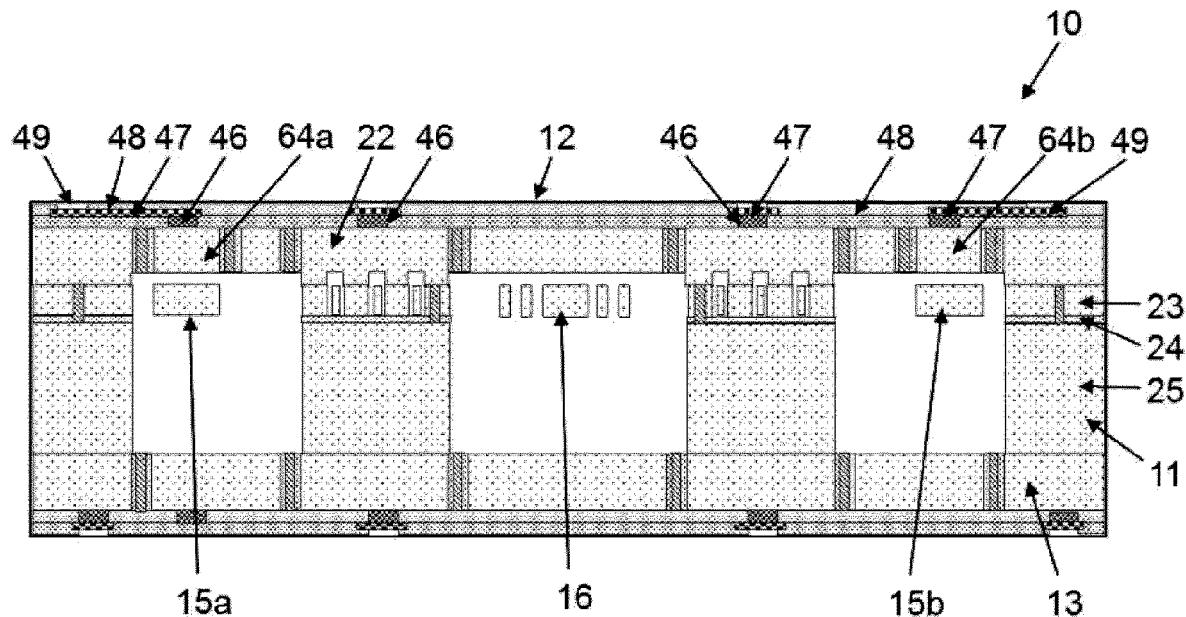
FIG. 14 is a cross-sectional side view of an embodiment of the 3D MEMS magnetometer during a manufacturing process thereof, showing the metallization, protective oxide deposition, and contact patterning in the top and bottom cap wafers, the bottom cap wafer being provided with feedthroughs.
Figure 15:
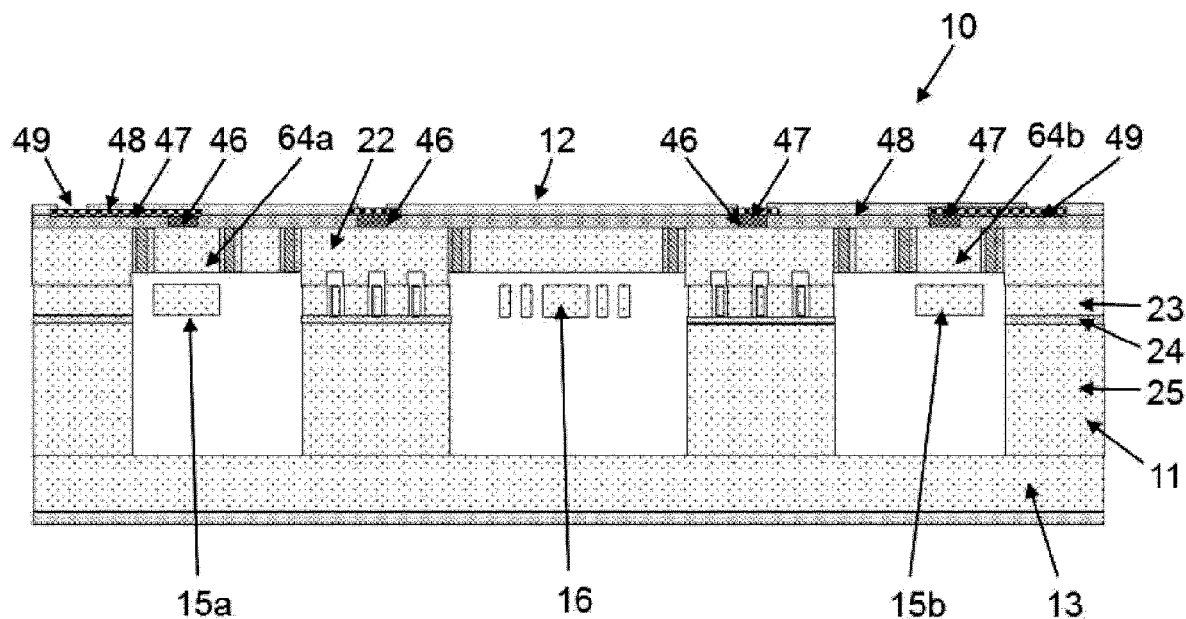
FIG. 15 is a cross-sectional side view of another embodiment of the 3D MEMS magnetometer during a manufacturing process thereof, showing the metallization, protective oxide deposition, and contact patterning in the top cap wafer, the bottom cap wafer being provided without electrical feedthroughs.

Referring to FIG. 14, electrical contacts 46 can be opened over the electrical connections 19, 20, 21, 22 (see FIG. 1 for electrical connections 19, 20, 21) and sense electrodes 64a, 64b in the top cap wafer 12. Bond pad and metallic electrical leads 47 can be applied and patterned by etching. Finally, to protect the metallic electrical leads 47, an additional layer of protective oxide 48 can be deposited and contacts 49 can be opened in the protective oxide 48 over the bond pads to provide electrical access. In this way, the electrical connections from the magnetometer transducers and any signals fed through the MEMS chip from the bottom cap wafer 13 are accessible from the top for wire bonding, flip chip bonding, or wafer bonding. Another embodiment in which the transducer signals are accessed only through the top cap wafer is shown in FIG. 15. Here the SOI shunts and bottom cap feedthroughs are omitted, simplifying fabrication.

Figure 16A:
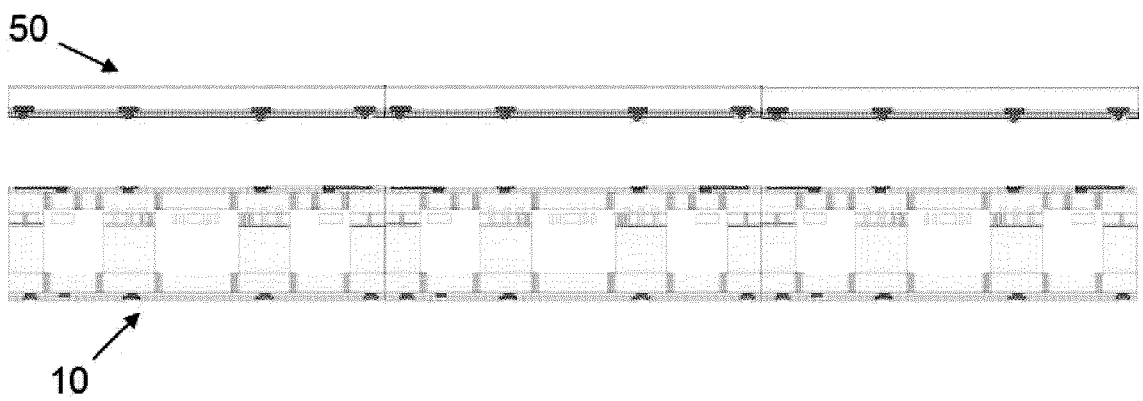
FIG. 16A illustrates an embodiment of a 3D MEMS magnetometer and an IC wafer prior to wafer bonding.
Figure 16B:
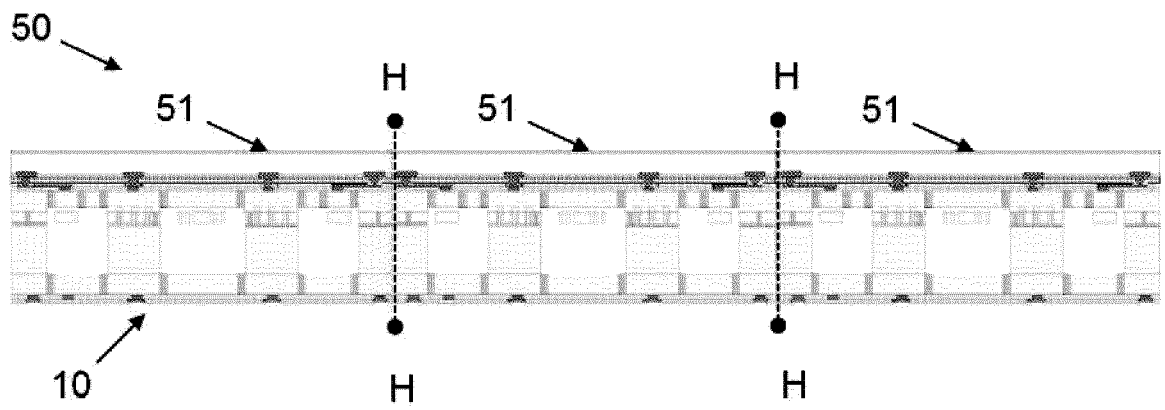
FIG. 16B shows an IC wafer bonded to an embodiment of a 3D MEMS magnetometer wafer with feedthroughs.
Figure 16C:
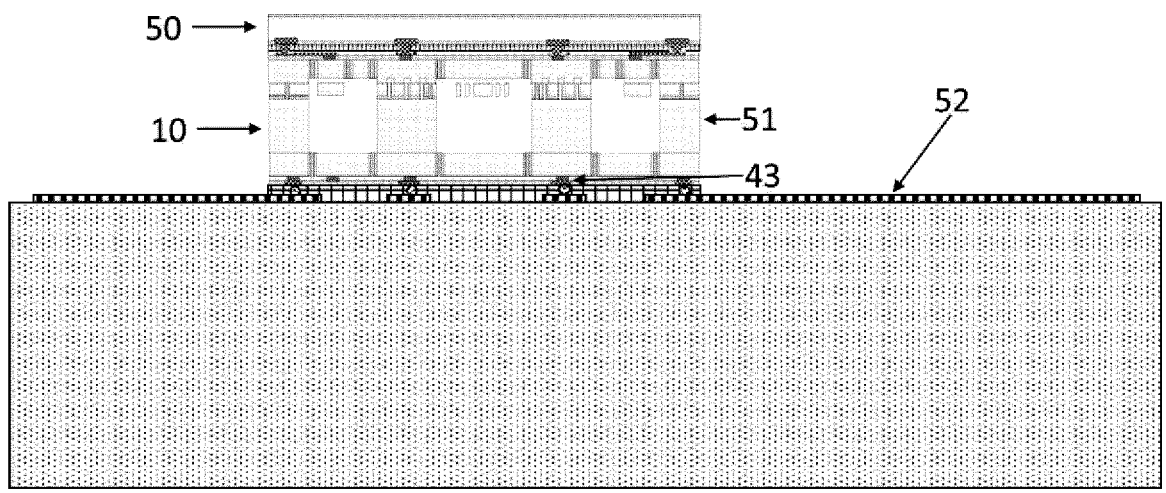
FIG. 16C shows an embodiment of a 3D MEMS magnetometer/IC component forming a 3D system (3DS) and bonded to a printed circuit board (PCB) from the MEMS side.

An advantage of some embodiments of the 3D magnetometer architecture described herein is that it enables system level wafer-scale integration with an integrated circuit (IC) wafer. As shown in FIG. 16A, the MEMS magnetometer wafer 10 is mated with a custom system IC wafer 50 of matching chip size and bond pad layout. This enables wafer-level bonding of the MEMS magnetometer wafer 10 and the IC wafer 50 at the wafer level, as shown in FIG. 16B. The bonded wafers 10, 50 can then be diced (along the lines HH in FIG. 16B) into hermetically sealed magnetometer component chips 51. If SOI conducting shunts 33 and bottom cap electrical connections or feedthroughs 43 have been included as shown in FIG. 16C, the signals from the IC wafer 50 can also be routed through the MEMS magnetometer 10, enabling direct flip-chip bonding of the magnetometer component to a printed circuit board (PCB) 52 through the MEMS electrical connections 43, without any additional wire bonding or packaging.

Figure 17A:
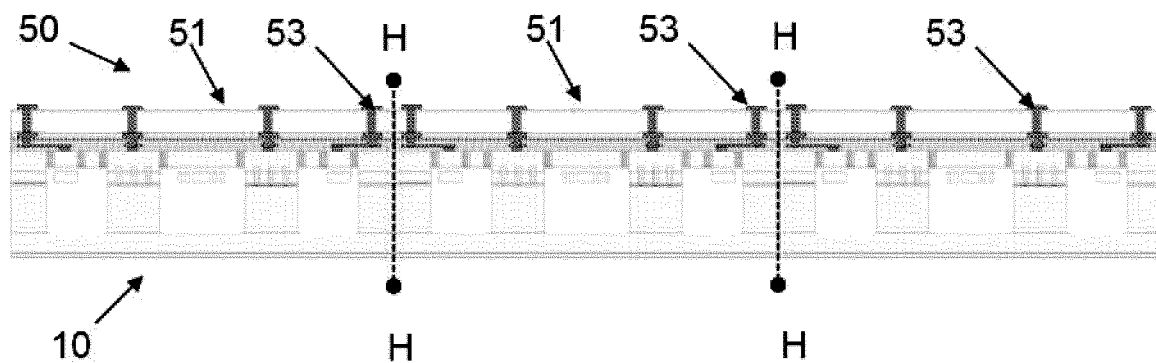
FIG. 17A shows an embodiment of an IC wafer with through-silicon-vias (TSVs) bonded to a 3D MEMS magnetometer wafer without feedthroughs.
Figure 17B:
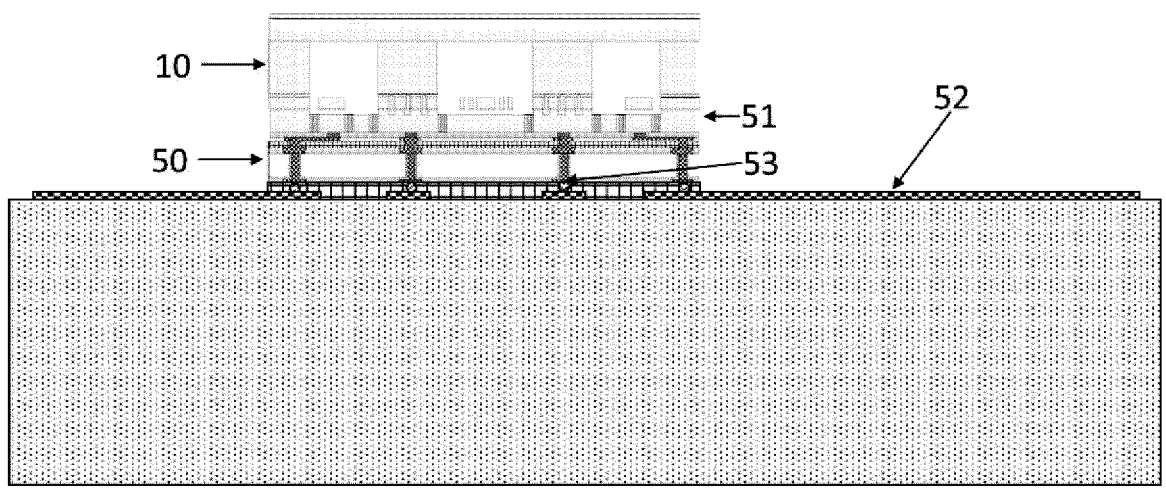
FIG. 17B shows an embodiment of a 3DS MEMS magnetometer/IC component bonded to a PCB from the IC side.

Referring to FIG. 17A, if the MEMS magnetometer wafer 10 does not include bottom cap electrical connections, it can alternatively be bump-bonded at the wafer level to an IC wafer 50 with through-silicon-vias (TSVs) 53. TSV technology has been developed for CMOS to enable multi-level CMOS chip bonding developed for imagers and multi-chip memory. The bond pads of the MEMS magnetometer wafer 10 can thus be directly connected to TSVs 53 of the CMOS IC wafer 50. Referring to FIG. 17B, the bonded MEMS magnetometer wafer 10 and CMOS wafer 50 can then be diced and the magnetometer component chips 51 directly flip-chip bonded to a PCB 52 through the TSVs 53.

The scope of the claims should not be limited by the preferred embodiments set forth in the examples, but should be given the broadest interpretation consistent with the description as a whole.

The invention claimed is:

1. A three-dimensional (3D) micro-electro-mechanical system (MEMS) magnetometer for measuring first, second and third magnetic field components respectively along mutually orthogonal first, second and third axes, the 3D MEMS magnetometer comprising:
   a MEMS wafer having opposed top and bottom sides, the MEMS wafer comprising a silicon-on-insulator (SOI) wafer including a MEMS device layer, a MEMS handle layer and a MEMS insulating layer between the MEMS device layer and the MEMS handle layer, the MEMS wafer further comprising a frame structure and current-carrying first, second and third magnetic field transducers formed in the MEMS device layer;
   a top cap wafer and a bottom cap wafer respectively bonded to the top side and the bottom side of the MEMS wafer, the top cap wafer, the bottom cap wafer and the MEMS wafer being electrically conductive, the top cap wafer, the bottom cap wafer and the frame structure forming, in combination, one or more cavities, each cavity enclosing at least one of the first, second and third magnetic field transducers, each magnetic field transducer being enclosed in one of the one or more cavities; and
   first, second and third electrode assemblies, the first and second electrode assemblies each being formed in either, or both, of the top and bottom cap wafers, each of the first, second and third electrode assemblies being configured to sense an output of a respective one of the first, second and third magnetic field transducers induced by a respective one of the first, second and third magnetic field components.

2. The 3D MEMS magnetometer according to claim 1, wherein each of the first, second and third electrode assemblies is configured to capacitively sense a displacement of the respective one of the first, second and third magnetic field transducers in response to a Lorentz force produced by the respective one of the first, second and third magnetic field components.

3. The 3D MEMS magnetometer according to claim 2, wherein the first and second magnetic field transducers are suspended from the frame structure, configured to carry a current along the second and first axes, respectively, and deflectable along the third axis in response to the Lorentz force produced by the first and second magnetic field components, respectively.

4. The 3D MEMS magnetometer according to claim 3, wherein the first magnetic field transducer comprises a first pair of elongated transducer elements extending along the second axis, and wherein the second magnetic field transducer comprises a second pair of elongated transducer elements extending along the first axis.

5. The 3D MEMS magnetometer according to claim 4, wherein:
the first pair of elongated transducer elements are configured to carry equal and opposite currents;
the first electrode assembly forms a first pair of capacitors with the first pair of elongated transducer elements and is configured to measure a first differential capacitance between the first pair of capacitors, the first differential capacitance being indicative of a magnitude of the first magnetic field component;
the second pair of elongated transducer elements are configured to carry equal and opposite currents; and
the second electrode assembly forms a second pair of capacitors with the second pair of elongated transducer elements and is configured to measure a second differential capacitance between the second pair of capacitors, the second differential capacitance being indicative of a magnitude of the second magnetic field component.

6. The 3D MEMS magnetometer according to claim 1, wherein each of the first and second electrode assemblies comprises one or more sense electrodes, each sense electrode being laterally bordered by an insulating closed-loop trench extending along the third axis and at least partially into the either one of the top and bottom cap wafers.

7. The 3D MEMS magnetometer according to claim 1, wherein the third magnetic field transducer comprises a stationary transducer element and a movable transducer element respectively fixed and displaceable in a plane perpendicular to the third axis relative to the frame structure, the movable transducer element being configured to carry a current in said plane.

8. The 3D MEMS magnetometer according to claim 7, wherein the third electrode assembly is configured to capacitively sense a relative motion between the stationary transducer element and the movable transducer element, said relative motion being indicative of a magnitude of the third magnetic field component.

9. The 3D MEMS magnetometer according to claim 8, wherein the third electrode assembly forms an interdigitated capacitive structure comprising at least one first set of conductive digits provided on the stationary transducer element and at least one second set of conductive digits provided on the movable transducer element, the at least one first set and the at least one second set of conductive digits being interlocked and capacitively coupled with each other.

10. The 3D MEMS magnetometer according to claim 1, wherein the third electrode assembly is formed in the MEMS wafer.

11. The 3D MEMS magnetometer according to claim 10, further comprising:
one or more electrical contacts formed on an outer side of the top cap wafer; and
an electrically conductive path extending across and through the top cap wafer to electrically connect the one or more electrical contacts to the third electrode assembly.

12. The 3D MEMS magnetometer according to claim 1, wherein the top cap wafer, the bottom cap wafer and the MEMS wafer are each made at least partially of silicon-based material.

13. The 3D MEMS magnetometer according to claim 1, wherein the MEMS device layer is bonded to the top cap wafer, the MEMS handle layer is bonded to the bottom cap wafer in the frame structure, and wherein each magnetic field transducer is positioned over a cavity formed in the MEMS handle layer and the MEMS insulating layer.

14. The 3D MEMS magnetometer according to claim 1, wherein at least one of the top cap wafer and the bottom cap wafer is a silicon-on-insulator wafer including a cap device layer, a cap handle layer, and a cap insulating layer interposed therebetween.

15. The 3D MEMS magnetometer according to claim 1, wherein at least one of the one or more cavities is a hermetically sealed vacuum cavity.

16. The 3D MEMS magnetometer according to claim 1, wherein the one or more cavities consist of a single cavity enclosing the first, second and third magnetic field transducers.

17. The 3D MEMS magnetometer according to claim 1, wherein the first, second and third magnetic field transducers form respective first, second and third resonant structures having associated resonant frequencies, each of the first, second and third magnetic field transducers configured to carry current at a frequency matching the resonant frequency associated thereto.

18. A 3D MEMS magnetometer for measuring first, second and third magnetic field components respectively along mutually orthogonal first, second and third axes, the 3D MEMS magnetometer comprising:
a MEMS wafer having opposed top and bottom sides, the MEMS wafer comprising a frame structure and current-carrying first, second and third magnetic field transducers, the MEMS wafer being a silicon-on-insulator (SOI) wafer with a MEMS device layer, a MEMS handle layer, and a MEMS insulating layer interposed between the MEMS device layer and the MEMS handle layer, the first, second and third magnetic field transducers being formed in the MEMS device layer such that each magnetic field transducer is separated from the MEMS insulating layer;
a top cap wafer and a bottom cap wafer respectively bonded to the MEMS device layer and the MEMS handle layer, the top cap wafer, the bottom cap wafer and the MEMS wafer being electrically conductive, the top cap wafer, the bottom cap wafer and the frame structure forming, in combination, one or more cavities, each cavity enclosing at least one of the first, second and third magnetic field transducers, each magnetic field transducer being enclosed in one of the one or more cavities; and first, second and third electrode assemblies, the first and second electrode assemblies each being formed in the top cap wafer, each of the first, second and third electrode assemblies being configured to sense an output of a respective one of the first, second and third magnetic field transducers induced by a respective one of the first, second and third magnetic field components.

19. The 3D MEMS magnetometer according to claim 18, wherein the top cap SOI wafer comprising a top cap device layer bonded to the MEMS device layer, a top cap handle layer, and a top cap insulating layer interposed between the top cap device layer and the top cap handle layer.

20. The 3D MEMS magnetometer according to claim 19, wherein each of the first and second electrode assemblies is etched in the top cap device layer.

21. The 3D MEMS magnetometer according to claim 20, wherein the top cap wafer includes recesses formed therein, and the recesses defining capacitor gaps between the first electrode assembly and the first magnetic field transducer, and between the second electrode assembly and the second magnetic field transducer.

22. The 3D MEMS magnetometer according to claim 21, further comprising:
at least one first electrical contact formed on an outer side of the top cap handle layer, and a first electrically conductive path extending across and successively through the top cap handle, insulating and device layers to electrically connect the at least one first electrical contact to the first electrode assembly; and
at least one second electrical contact formed on an outer side of the top cap handle layer, and a second electrically conductive path extending across and successively through the top cap handle, insulating and device layers and to electrically connect the at least one second electrical contact to the second electrode assembly.

23. The 3D MEMS magnetometer according to claim 18, wherein the third electrode assembly is formed in the MEMS device layer.

24. The 3D MEMS magnetometer according to claim 22, further comprising:
at least one third electrical contact formed on an outer side of the top cap wafer; and
a third electrically conductive path extending across and through the top cap wafer to electrically connect the at least one third electrical contacts to the third electrode assembly.

25. The 3D MEMS magnetometer according to claim 18, wherein each of the first, second and third electrode assemblies is configured to capacitively sense a displacement of the respective one of the first, second and third magnetic field transducers in response to a Lorentz force produced by the respective one of the first, second and third magnetic field components.

26. The 3D MEMS magnetometer according to claim 25, wherein the first and second magnetic field transducers are suspended from the frame structure, configured to carry a current along the second and first axes, respectively, and deflectable along the third axis in response to the Lorentz force produced by the first and second magnetic field components, respectively.

27. The 3D MEMS magnetometer according to claim 26, wherein the first magnetic field transducer comprises a first pair of elongated transducer elements extending along the second axis, and wherein the second magnetic field transducer comprises a second pair of elongated transducer elements extending along the first axis.

28. The 3D MEMS magnetometer according to claim 27, wherein:
the first pair of elongated transducer elements are configured to carry equal and opposite currents;
the first electrode assembly forms a first pair of capacitors with the first pair of elongated transducer elements and is configured to measure a first differential capacitance between the first pair of capacitors, the first differential capacitance being indicative of a magnitude of the first magnetic field component;
the second pair of elongated transducer elements are configured to carry equal and opposite currents; and
the second electrode assembly forms a second pair of capacitors with the second pair of elongated transducer elements and is configured to measure a second differential capacitance between the second pair of capacitors, the second differential capacitance being indicative of a magnitude of the second magnetic field component.

29. The 3D MEMS magnetometer according to claim 18, wherein each of the first and second electrode assemblies comprises one or more sense electrodes, each sense electrode being laterally bordered by an insulating closed-loop trench extending along the third axis and at least partially into the top cap wafer.

30. The 3D MEMS magnetometer according to claim 18, wherein the third magnetic field transducer comprises a stationary transducer element and a movable transducer element respectively fixed and displaceable in a plane perpendicular to the third axis, the movable transducer element being configured to carry a current along at said plane.

31. The 3D MEMS magnetometer according to claim 30, wherein the third electrode assembly is configured to capacitively sense a relative motion between the stationary transducer element and the movable transducer element, said relative motion being indicative of a magnitude of the third magnetic field component.

32. The 3D MEMS magnetometer according to claim 31, wherein the third electrode assembly forms an interdigitated capacitive structure comprising at least one first set of conductive digits provided on the stationary transducer element and at least one second set of conductive digits provided on the movable transducer element, the at least one first set and the at least one second set of conductive digits being interlocked and capacitively coupled with each other.

33. The 3D MEMS magnetometer according to claim 18, wherein at least one of the one or more cavities is a hermetically sealed vacuum cavity.

34. The 3D MEMS magnetometer according to claim 18, wherein the one or more cavities comprises a single cavity enclosing the first, second and third magnetic field transducers.

35. A method for measuring first, second and third magnetic field components along mutually orthogonal first, second and third axes, respectively, the method comprising:
operating a three-dimensional (3D) micro-electro-mechanical system (MEMS) magnetometer comprising a silicon-on-insulator (SOI) MEMS wafer having opposed top and bottom sides, the SOI MEMS wafer including a MEMS device layer, a MEMS handle layer and an insulating layer between the MEMS device layer and the MEMS handle layer, the SOI MEMS wafer further comprising a frame structure and current-carrying first, second and third magnetic field transducers, a top cap wafer and a bottom cap wafer respectively bonded to the top side and the bottom side of the MEMS wafer, the top cap wafer, the bottom cap wafer and the MEMS wafer being electrically conductive, the top cap wafer, the bottom cap wafer and the frame structure forming, in combination, one or more cavities, each cavity enclosing at least one of the first, second and third magnetic field transducers, each magnetic field transducer being enclosed in one of the one or more cavities;

flowing current into each of the first, second and third magnetic field transducers; and sensing an output of each the first, second and third magnetic field transducers induced by and indicative of a respective one of the first, second and third magnetic field components.

36. The method according to claim 35, comprising:

flowing a first current into the first magnetic field transducer, the first magnetic field transducer being deflectable along the third axis and configured to carry the first current along the second axis;

sensing, as a first capacitance, a deflection of the first magnetic field transducer along the third axis in response to a first Lorentz force resulting from an interaction between the first current and the first magnetic field component, the first capacitance being indicative of a magnitude of the first magnetic field component;

flowing a second current into the second magnetic field transducer, the second magnetic field transducer being deflectable along the third axis and configured to carry the second current along the first axis;

sensing, as a second capacitance, a deflection of the second magnetic field transducer along the third axis in response to a second Lorentz force resulting from an interaction between the second current and the second magnetic field component, the second capacitance being indicative of a magnitude of the second magnetic field component;

flowing a third current into a movable transducer element of the third magnetic field transducer, the movable transducer element being displaceable relative to a stationary transducer element of the third magnetic field transducer and configured to carry the third current in a plane perpendicular to the third axis; and sensing, as a third capacitance, a relative motion between the stationary and movable transducing elements in said plane, the third capacitance being indicative of a magnitude of the third magnetic field component.

37. The method according to claim 35, further comprising sensing a magnetic field with the first and second magnetic field transducers are coupled to the frame structure, and configured to carry a current along the second and first axes, respectively, and deflectable along the third axis in response to a Lorentz force produced by the first and second magnetic field components.

38. The method according to claim 35, further comprising sensing a magnetic field with the first magnetic field transducer that comprises a first pair of elongated transducer elements extending along the second axis, and with the second magnetic field transducer that comprises a second pair of elongated transducer elements extending along the first axis.

* * * * *